(12) United States Patent
Ahn

(10) Patent No.: US 11,581,486 B2
(45) Date of Patent: Feb. 14, 2023

(54) ELECTRONIC DEVICE AND METHOD OF FABRICATING THE SAME

(71) Applicant: SK hynix Inc., Icheon (KR)

(72) Inventor: Jun Ku Ahn, Icheon (KR)

(73) Assignee: SK hynix Inc., Icheon (KR)

( * ) Notice: Subject to any disclaimer, the term of this patent is extended or adjusted under 35 U.S.C. 154(b) by 116 days.

(21) Appl. No.: 16/940,060

(22) Filed: Jul. 27, 2020

(65) Prior Publication Data

US 2021/0280782 A1 Sep. 9, 2021

(30) Foreign Application Priority Data

Mar. 3, 2020 (KR) .................. 10-2020-0026550

(51) Int. Cl.
*H01L 45/00* (2006.01)

(52) U.S. Cl.
CPC .......... *H01L 45/1286* (2013.01); *H01L 45/06* (2013.01); *H01L 45/1233* (2013.01); *H01L 45/14* (2013.01)

(58) Field of Classification Search
CPC ..................................................... H01L 45/06
See application file for complete search history.

(56) References Cited

U.S. PATENT DOCUMENTS

| 9,385,312 | B2 * | 7/2016 | Lee | .................... H01L 27/2481 |
| 2011/0069525 | A1 * | 3/2011 | Fukumizu | ............. H01L 45/146 365/63 |
| 2015/0179704 | A1 * | 6/2015 | Yoshida | ............. H01L 45/1683 257/5 |
| 2015/0214478 | A1 * | 7/2015 | Lee | ......................... H01L 45/08 257/5 |
| 2015/0325787 | A1 * | 11/2015 | Ahn | ..................... H01L 45/141 438/382 |
| 2018/0358556 | A1 * | 12/2018 | Kang | .................. H01L 45/1675 |
| 2019/0165046 | A1 * | 5/2019 | Wilkerson | .......... H01L 45/1675 |

FOREIGN PATENT DOCUMENTS

| KR | 101094985 B1 | 12/2011 |
| KR | 1020130059913 A | 6/2013 |
| KR | 101934003 B1 | 1/2019 |

* cited by examiner

*Primary Examiner* — Mounir S Amer

(57) ABSTRACT

An electronic device including a semiconductor memory is provided. The semiconductor memory includes a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions.

17 Claims, 38 Drawing Sheets

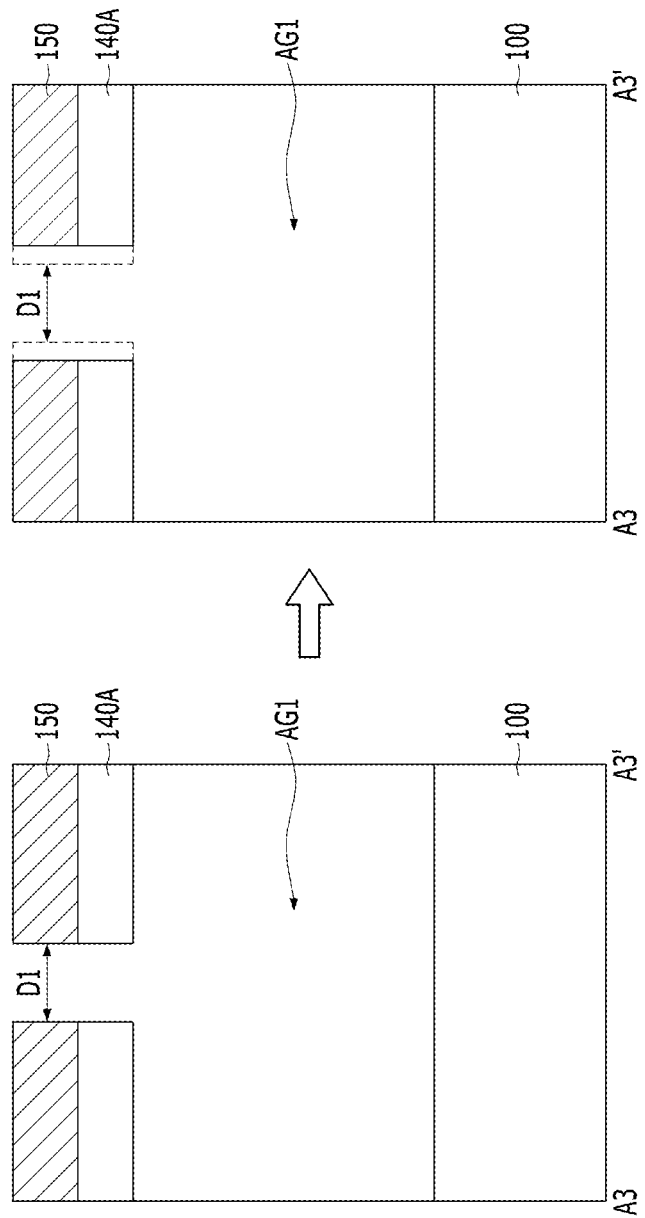

ELECTRONIC DEVICE AND METHOD OF FABRICATING THE SAME

CROSS-REFERENCE TO RELATED APPLICATIONS

The present application claims priority of Korean Patent Application No. 10-2020-0026550, filed on Mar. 3, 2020, which is incorporated herein by reference in its entirety.

TECHNICAL FIELD

This patent document relates to semiconductor devices, their applications in electronic devices or systems, and a method of fabricating the same.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and thus research has been conducted for the semiconductor devices. Such semiconductor devices may store data using a characteristic of switching between different resistance states according to an applied voltage or current. For example, the semiconductor devices include an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments relating to an electronic device capable of facilitating fabrication and securing reliability and operating characteristics, and to a method of fabricating the same.

In an embodiment, an electronic device includes a semiconductor memory, which includes: a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions.

In another embodiment, a method for fabricating an electronic device comprising a semiconductor memory, includes: forming a plurality of stacked structures extending in a first direction over a substrate, each of the stacked structures including a first line and an initial memory cell; forming first capping layers on both sidewalls of the stacked structure in a second direction crossing the first direction; forming a second capping layer blocking an upper portion of a space between first capping layers formed on sidewalls of two stacked structures that face each other in the second direction; forming a conductive layer over the stacked structures, the first capping layers, and the second capping layer; forming a plurality of mask patterns extending in the second direction over the conductive layer; etching the conductive layer, the stacked structures, the first capping layers and the second capping layer using the mask patterns as an etching barrier to form second lines, memory cells, first capping layer patterns, and second capping layer patterns, wherein a width between two neighboring memory cells in the first direction is greater than a width between the second capping layer patterns in the first direction; and forming a heat sink in a space between the second capping layer patterns.

These and other aspects, embodiments and associated advantages are described in greater detail in the drawings, the description and the claims.

DETAILED DESCRIPTION

Figure 1A:
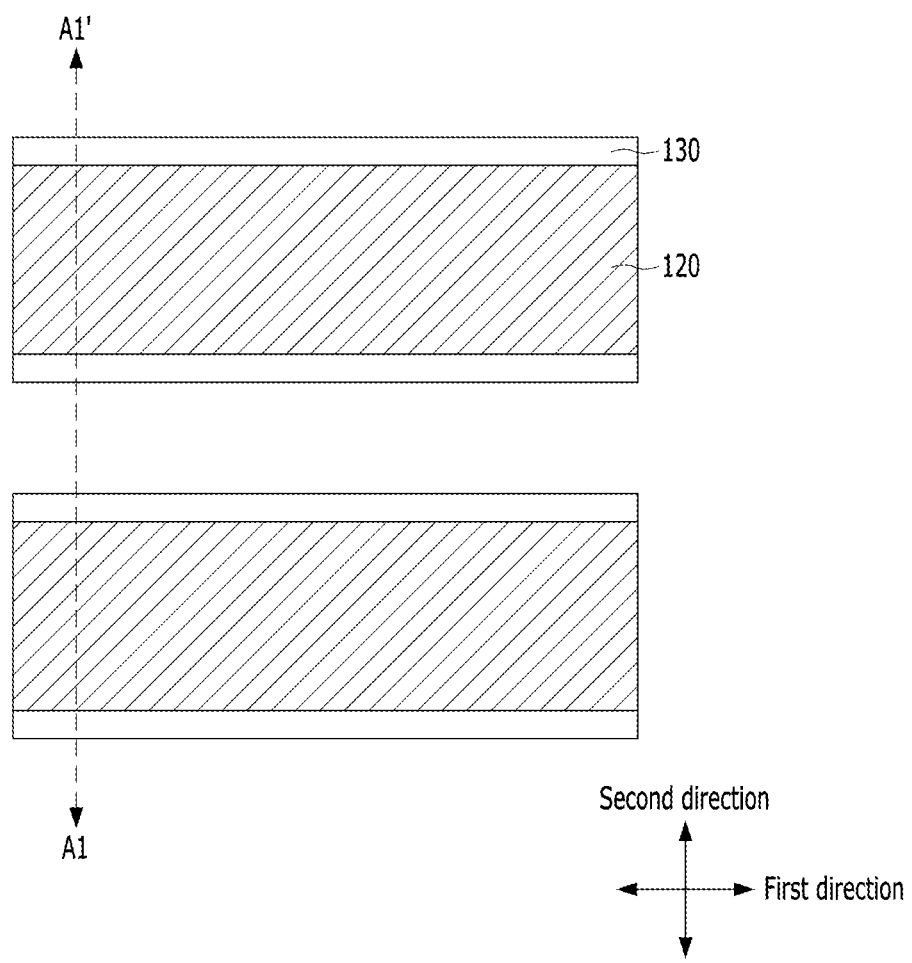
FIGS. 1A to 8D are views illustrating a semiconductor memory and a method of fabricating the same according to an embodiment of the present disclosure.

Various examples and embodiments of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before describing embodiments, a memory device to which the embodiments can be applied will be briefly described.

The embodiments can be applied to a memory device in which memory cells are arranged at intersections between lower lines and upper lines that cross each other.

Here, a memory cell may require heat or generate heat during an operation of the memory device. For example, the memory cell may include a phase change material. For reference, the phase change material may switch between an amorphous state and a crystalline state by Joule's heat generated according to a current flowing therethrough. When the phase change material is in the amorphous state, the phase change material may be in a relatively high resistance state, and when the phase change material is in the crystalline state, the phase change material may be in a relatively low resistance state. Data may be stored in the memory cell using the difference in resistance of the phase change material.

However, such heat generated in the memory cell may be transferred to the surroundings of the memory cell and cause a thermal disturbance that affects the phase change material of memory cells adjacent to the memory cell, so that resistance states of the adjacent memory cells may be changed. That is, due to the thermal disturbance, an error may occur in the operation of the memory device, and accordingly, a reliability of the memory device may be deteriorated.

Hereinafter, there will be proposed a memory device and a method of manufacturing the same, capable of solving the above problems, by reducing heat transfer between memory cells adjacent to each other during the operation of the memory device.

Figure 8A:
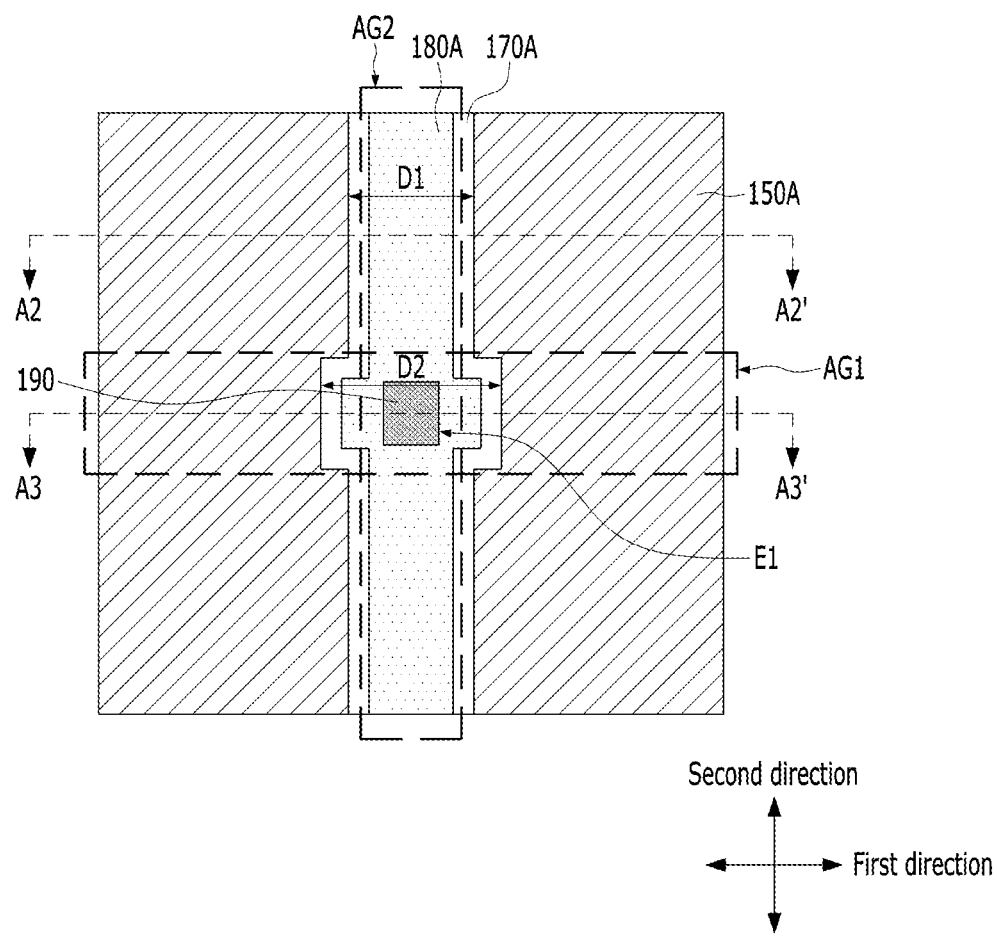
Figure 8B:
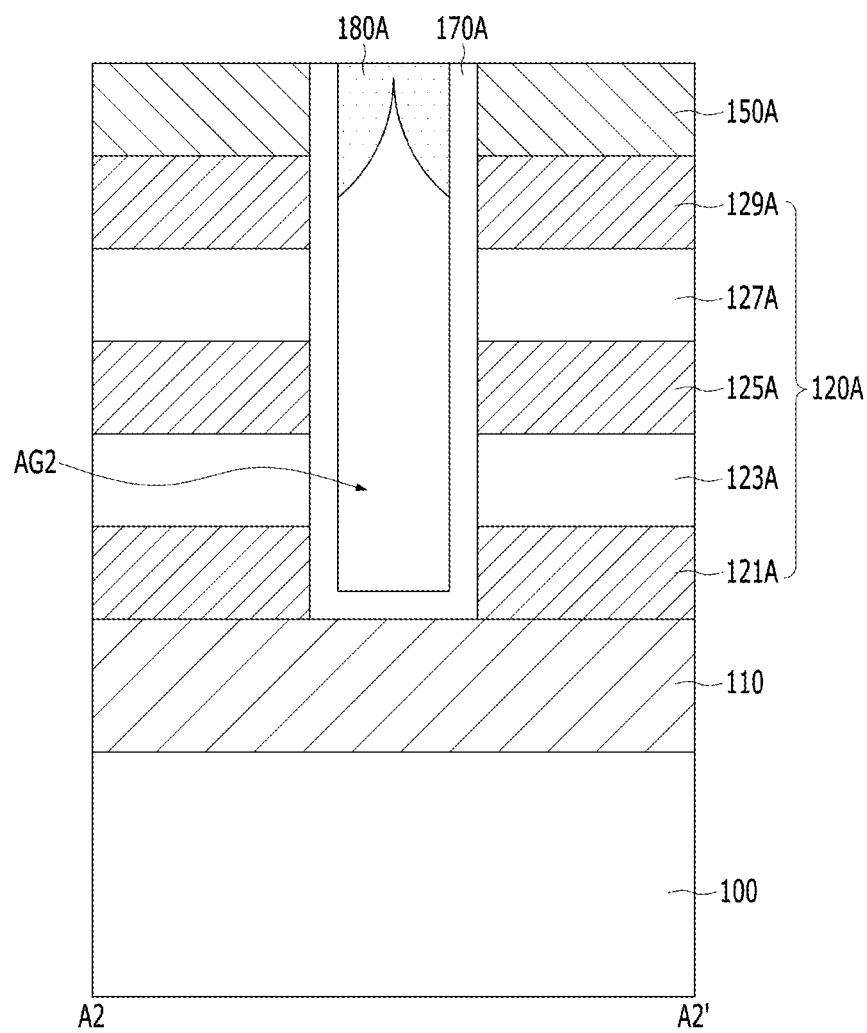
Figure 8C:
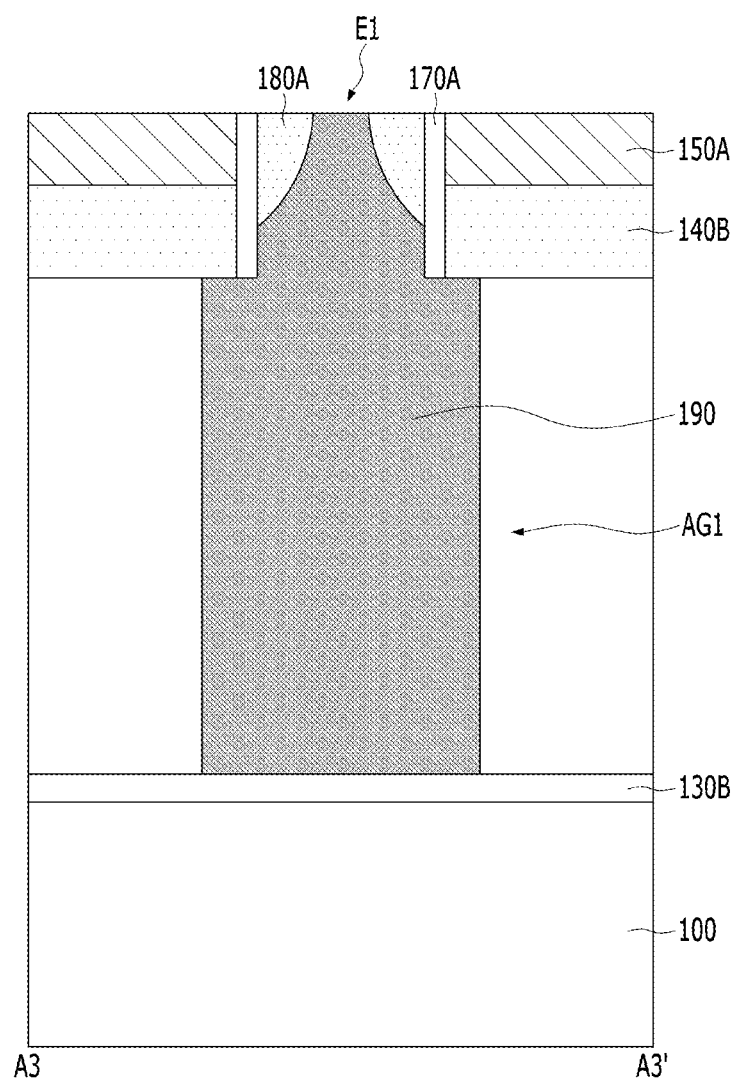
Figure 8D:
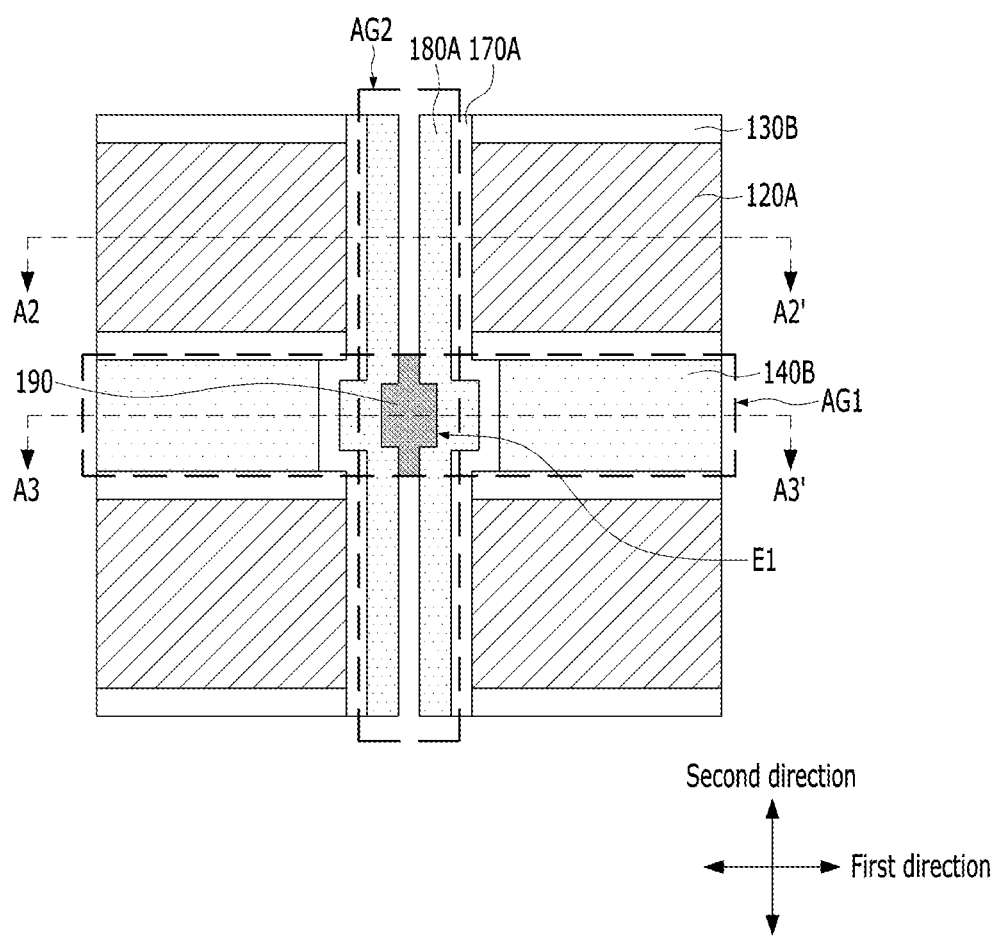

FIGS. 1A to 8D are views illustrating a semiconductor memory and a method of fabricating the same according to an embodiment of the present disclosure. If necessary, a plan view at a specific height and a cross-sectional view taken along a predetermined line of the plan view are shown. Specifically, FIGS. 1A, 2A, 3A, 4A, 5A, 6A, 7A, and 8A are plan views of the semiconductor memory viewed from above. FIGS. 1B, 2B, and 3B are cross-sectional views taken along lines A1-A1' of FIGS. 1A, 2A, and 3A, respectively. FIGS. 4B and 4C are cross-sectional views taken along lines A2-A2' and A3-A3' of FIG. 4A, respectively. FIGS. 5B and 5C are cross-sectional views taken along lines A2-A2' and A3-A3' of FIG. 5A, respectively, and FIG. 5D is a plan view at a height of an upper surface of a memory cell. FIGS. 6B and 6C are cross-sectional views taken along lines A2-A2' and A3-A3' of FIG. 6A, respectively, and FIG. 6D is a plan view at the height of the upper surface of the memory cell. FIGS. 7B and 7C are cross-sectional views taken along lines A2-A2' and A3-A3' of FIG. 7A, respectively, and FIG. 7D is a plan view at the height of the upper surface of the memory cell. FIGS. 8B and 8C are cross-sectional views taken along lines A2-A2' and A3-A3' of FIG. 8A, respectively, and FIG. 8D is a plan view at the height of the upper surface of the memory cell. FIGS. 5E and 5F are cross-sectional views for explaining intermediate processes between FIGS. 4A to 4C and FIGS. 5A to 5D.

First, the fabricating method will be described with reference to the drawings.

Figure 1B:
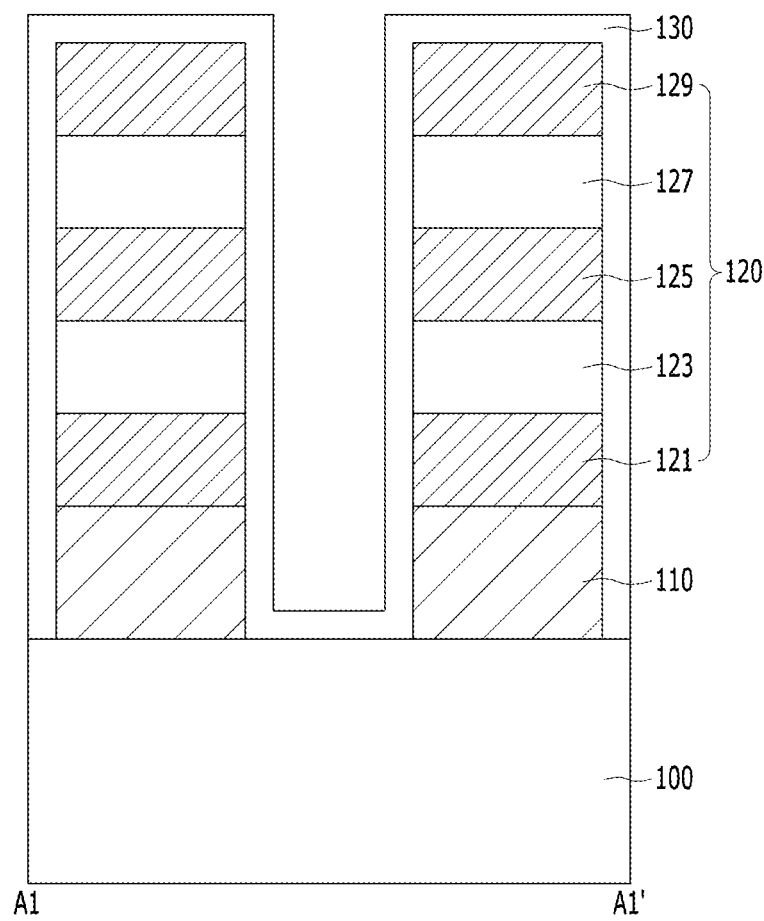

Referring to FIGS. 1A and 1B, a substrate 100 may be provided. The substrate 100 may include a semiconductor material such as silicon. In addition, a required lower structure (not shown) may be formed in the substrate 100. For example, transistors constituting an integrated circuit may be formed in the substrate 100.

Subsequently, a structure in which a first line 110 and an initial memory cell 120 are stacked may be formed over the substrate 100. Hereinafter, the structure in which the first line 110 and the initial memory cell 120 are stacked will be referred to as a stacked structure 110 and 120. The stacked structure 110 and 120 may have a line shape extending in a first direction, for example, a direction crossing the line A1-A1'. A plurality of stacked structures 110 and 120 may be arranged to be spaced apart from each other in a second direction crossing the first direction, for example, a direction parallel to the line A1-A1'. The first and second directions are perpendicular to a third direction in which the first line 110 and the initial memory cell 120 are stacked over the substrate 100. In this embodiment, two stacked structures 110 and 120 are shown, but the number of the stacked structures 110 and 120 arranged in the second direction may be variously modified.

The stacked structures 110 and 120 may be formed by sequentially forming a conductive layer for the first line 110 and one and more material layers for the initial memory cell 120 over the substrate 100, and etching the conductive layer and the material layers using a line-shaped mask pattern (not shown) extending in the first direction. Accordingly, the first line 110 and the initial memory cell 120 may overlap each other in a plan view and be aligned with each other in the third direction.

The first line 110 may include a conductive material, for example, a metal such as platinum (Pt), tungsten (W), aluminum (Al), copper (Cu), or tantalum (Ta), a metal nitride such as titanium nitride (TiN) or tantalum nitride (TaN), or a combination thereof. The first line 110 may function as a word line or a bit line.

The initial memory cell 120 may include various materials and have any of various layer structures as long as it can store data according to a voltage or current applied to the first line 110 and a second line to be described below. In the present embodiment, the initial memory cell 120 may store data using a variable resistance characteristic switching between different resistance states. In an embodiment, the initial memory cell 120 may include a lower electrode layer 121, a selection element layer 123, an intermediate electrode layer 125, a variable resistance layer 127, and an upper electrode layer 129.

The lower electrode layer 121 and the upper electrode layer 129 may be located at both ends of the initial memory cell 120, for example, at the bottom and the top in the third direction, respectively, and transfer a voltage required for an operation of the initial memory cell 120 to the other layers of the initial memory cell 120. The intermediate electrode layer 125 may electrically connect the selection element layer 123 and the variable resistance layer 127 while physically separating them. One or more of the lower electrode layer 121, the intermediate electrode layer 125, and the upper electrode layer 129 may include a conductive material, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, one or more of the lower electrode layer 121, the intermediate electrode layer 125, and the upper electrode layer 129 may include a carbon electrode layer.

The selection element layer 123 may prevent a current leakage from occurring between memory cells. The initial memory cell 120 may be patterned in a subsequent process to transform into an island-shaped memory cell, and the island-shaped memory cell may be located at an intersection between the first line 110 and the second line. Here, when the memory cells share the first line 110 or the second line, the current leakage may occur between the memory cells through the shared line. Therefore, the selection element layer 123 may function to block such current leakage. To this end, the selection element layer 123 may have a switching characteristic for blocking or hardly allowing a current to flow therein when a magnitude of an applied voltage is less than a predetermined threshold value and for allowing a current flowing therein to abruptly increase when the magnitude of the applied voltage is equal to or above the threshold value. The threshold value may be referred to as a threshold voltage, and the selection element layer 123 may be implemented in a turn-on state or a turn-off state based on the threshold voltage.

The selection element layer 123 may include a diode, an OTS (Ovonic Threshold Switching) material such as a chalcogenide material, an MIEC (Mixed Ionic Electronic Conducting) material such as a chalcogenide material containing a metal, an MIT (Metal Insulator Transition) material such as $NbO_2$, $VO_2$, or the like, or a tunneling insulating material having a relatively wide band gap such as $SiO_2$, $Al_2O_3$, or the like.

The variable resistance layer 127 may be a portion of the initial memory cell 120 that stores data. To this end, the variable resistance layer 127 may have a variable resistance characteristic that switches between different resistance states depending on an applied voltage or current. The variable resistance layer 127 may have a single-layered structure or a multi-layered structure including at least one of materials used for an RRAM, a PRAM, an MRAM, an FRAM, or the like. For example, the variable resistance layer 127 may include a metal oxide such as a perovskite-based oxide or a transition metal oxide, a phase change material such as a chalcogenide-based material, a ferromagnetic material, or a ferroelectric material, or the like. For example, the resistance state of the variable resistance layer 127 may change due to heat when the variable resistance layer 127 includes a phase change material.

In this embodiment, the initial memory cell 120 includes the lower electrode layer 121, the selection element layer 123, the intermediate electrode layer 125, the variable resistance layer 127, and the upper electrode layer 129 which are sequentially stacked. However, embodiments are not limited thereto. In another embodiment, except for the variable resistance layer 127, at least one of the layers 121, 123, 125, and 129 may be omitted. Alternatively, their stacking order may be changed. For example, locations of the variable resistance layer 127 and the selection element layer 123 may be reversed. Alternatively, one or more other layers (not shown) may be included in the initial memory cell 120 in addition to the layers 121, 123, 125, 127, and 129.

Subsequently, a first capping layer 130 may be formed over the substrate 100 on which the stacked structures 110 and 120 are formed. That is, the first capping layer 130 may be formed along a profile of a resultant structure including the stacked structures 110 and 120 formed over the substrate 100.

The first capping layer 130 may be formed using a film and/or a process having excellent step coverage characteristics. For example, the first capping layer 130 may be formed by an ALD (Atomic Layer Deposition) method. Accordingly, the first capping layer 130 may be formed along side surfaces (or sidewalls) and upper surfaces of the stacked structures 110 and 120. In addition, the first capping layer 130 may have a small thickness so that it does not completely fill a space between the stacked structures 110 and 120.

The first capping layer 130 may protect the initial memory cell 120 in a subsequent process. The first capping layer 130 may include an insulating material, and may have a single-layered structure or a multi-layered structure. For example, the first capping layer 130 may include a silicon oxide, a silicon nitride, an insulating metal oxide, an insulating metal nitride, or a combination thereof.

Figure 2A:
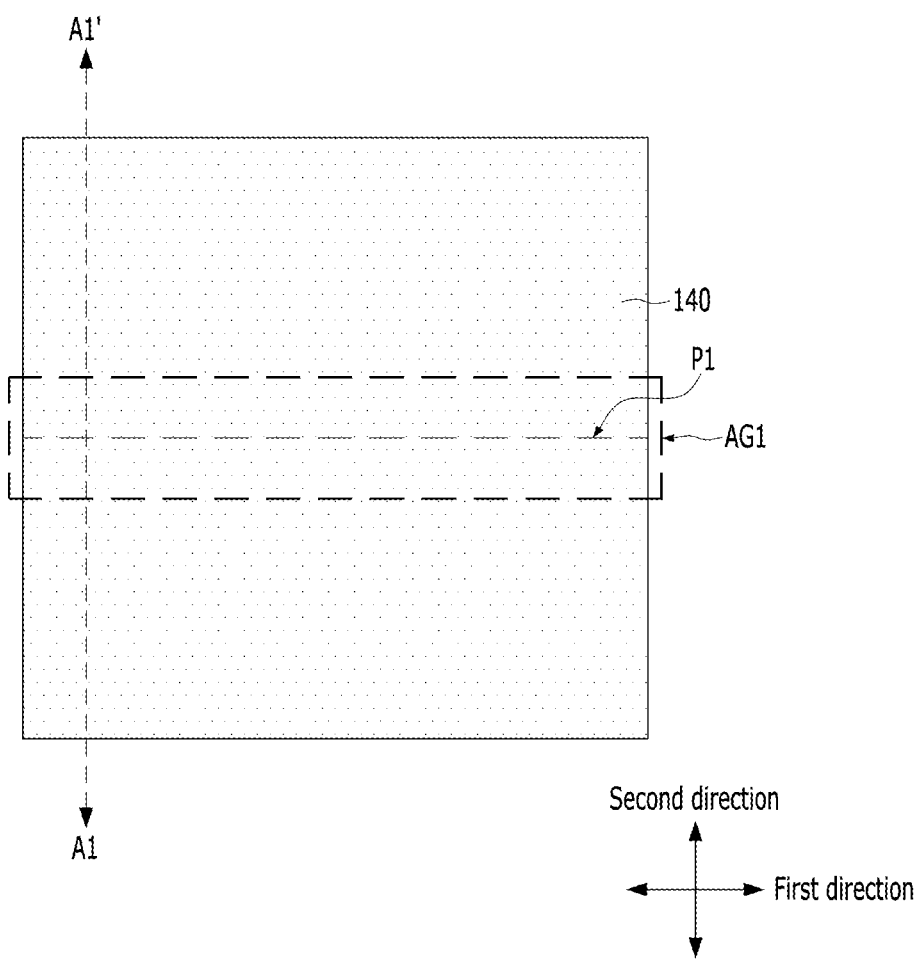
Figure 2B:
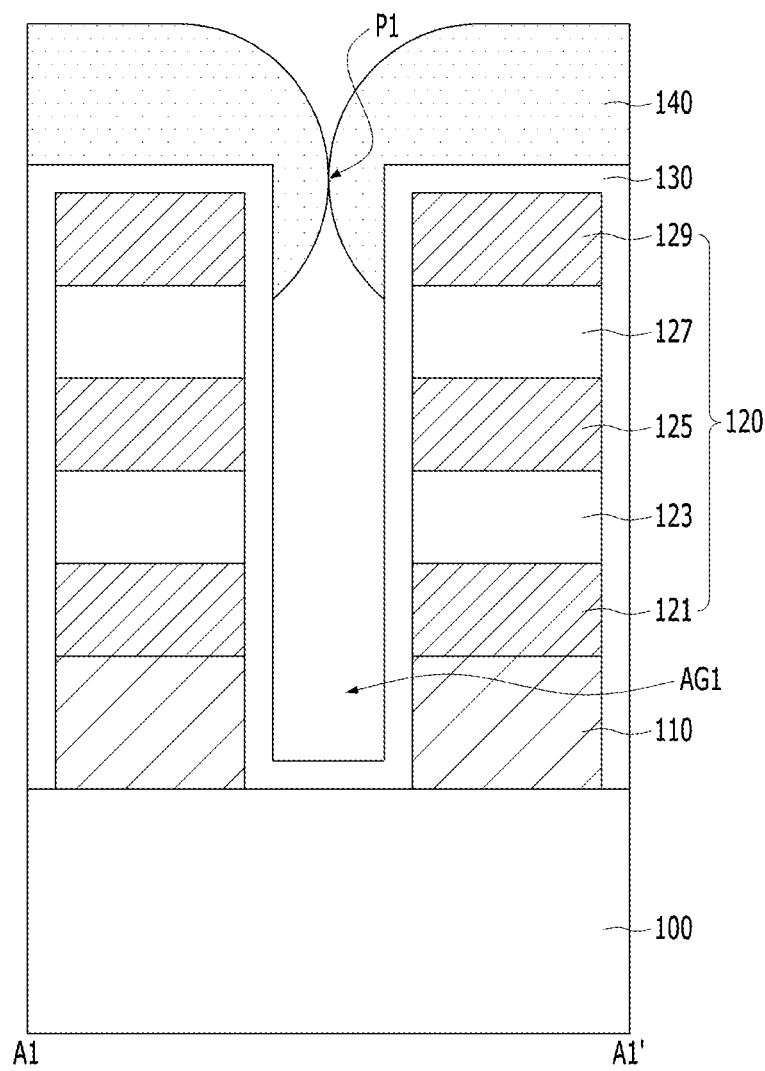

Referring to FIGS. 2A and 2B, a second capping layer 140 may be formed over a resultant structure of FIGS. 1A and 1B.

The second capping layer 140 may be formed using a film and/or a process having poor step coverage characteristics. For example, the second capping layer 140 may be formed by a deposition method using HDP (High Density Plasma). Accordingly, the second capping layer 140 may be formed to be thick only over upper portions of the stacked structures 110 and 120. That is, the second capping layer 140 may be formed only over upper surfaces of the stacked structures 110 and 120 and sidewalls of the upper portions of the stacked structures 110 and 120. The second capping layer 140 may have an overhang whose side protrudes more toward the space between the stacked structures 110 and 120 in the second direction than the first capping layer 130 on the sidewalls of the initial memory cell 120. The overhangs of the second capping layers 140 formed over two neighboring stacked structures 110 and 120 may contact each other (see P1) to close up the space between the two neighboring stacked structures 110 and 120. As a result, a first air gap AG1 surrounded by the first capping layer 130 and the second capping layer 140 may be formed. A side surface (or sidewall) and a lower surface of the first air gap AG1 may be defined by the first capping layer 130 that is formed along an upper surface of the substrate 100 and the side surfaces of the two neighboring stacked structures 110 and 120 that face each other, and an upper surface of the first air gap AG1 may be defined by the second capping layer 140. For convenience of description, the first air gap AG1 is indicated by a thick dotted line in the plan view of FIG. 2A. The first air gap AG1 may extend along the first direction, similar to the space between the two neighboring stacked structures 110 and 120 described in FIGS. 1A and 1B.

The second capping layer 140 may include an insulating material. For example, the second capping layer 140 may include a silicon oxide, a silicon nitride, an insulating metal oxide, an insulating metal nitride, or a combination thereof. The second capping layer 140 may be formed of a different material from the first capping layer 130.

Figure 3A:
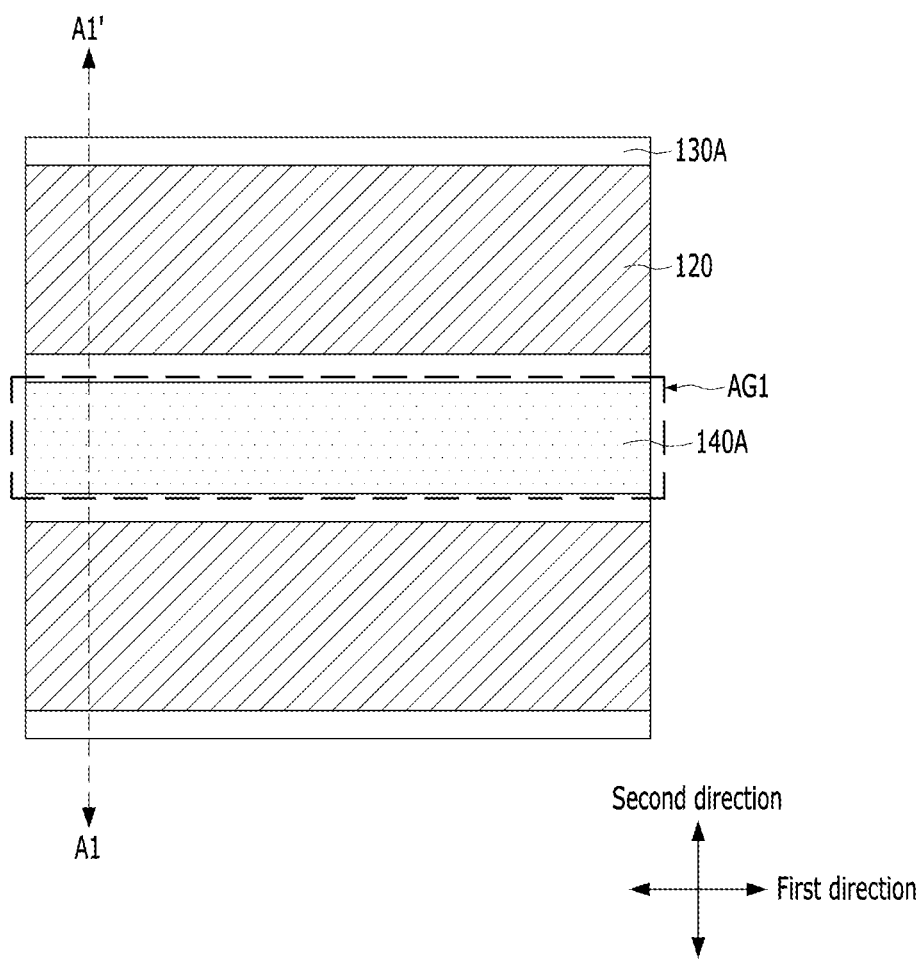
Figure 3B:
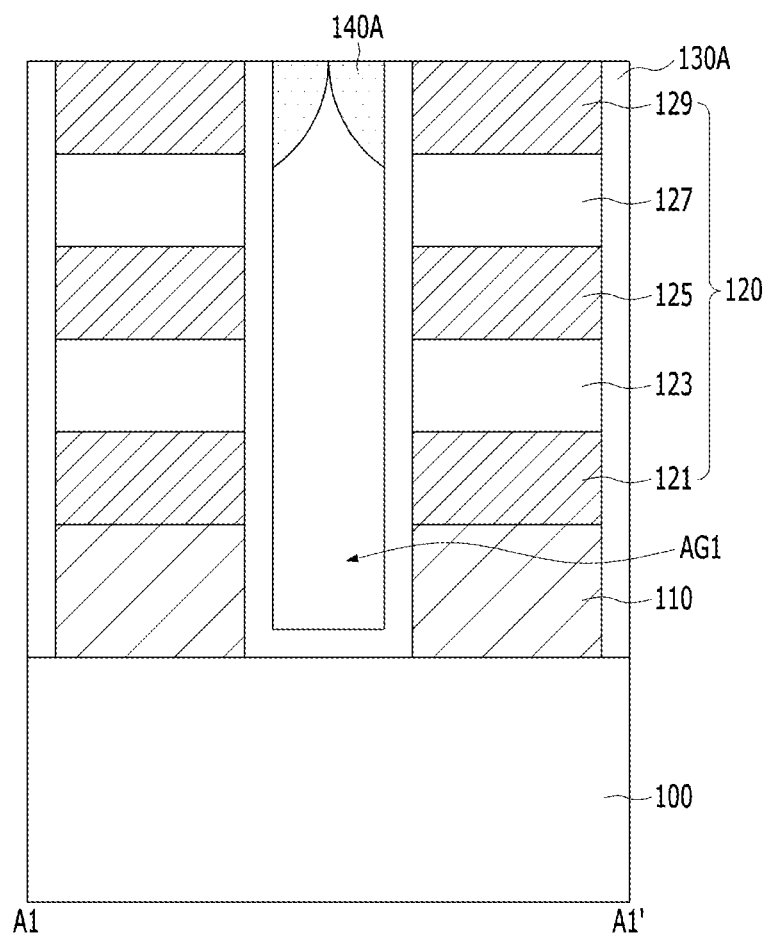

Referring to FIGS. 3A and 3B, a planarization process such as a chemical mechanical polishing (CMP) process may be performed until an upper surface of the initial memory cell 120, for example, an upper surface of the upper electrode layer 129, is exposed. As a result, the first capping layer 130 and the second capping layer 140 on the upper surface of the initial memory cell 120 may be removed to form a first capping layer pattern 130A and a second capping layer pattern 140A between the two neighboring stacked structures 110 and 120.

The first capping layer pattern 130A may be formed along the side surfaces of the two neighboring stacked structures 110 and 120 that face each other and the upper surface of the substrate 100 between the two neighboring stacked structures 110 and 120. The second capping layer pattern 140A may have a line shape extending in the first direction while closing up the space between the two neighboring stacked structures 110 and 120. An upper surface of the first capping layer pattern 130A and an upper surface of the second capping layer pattern 140A may form a flat surface together with the upper surface of the initial memory cell 120. That is, the upper surfaces of the first capping layer pattern 130A and the second capping layer pattern 140A may be level with the upper surface of the upper electrode layer 129.

During the planarization process, the first air gap AG1 under the second capping layer pattern 140A may be maintained.

Figure 4A:
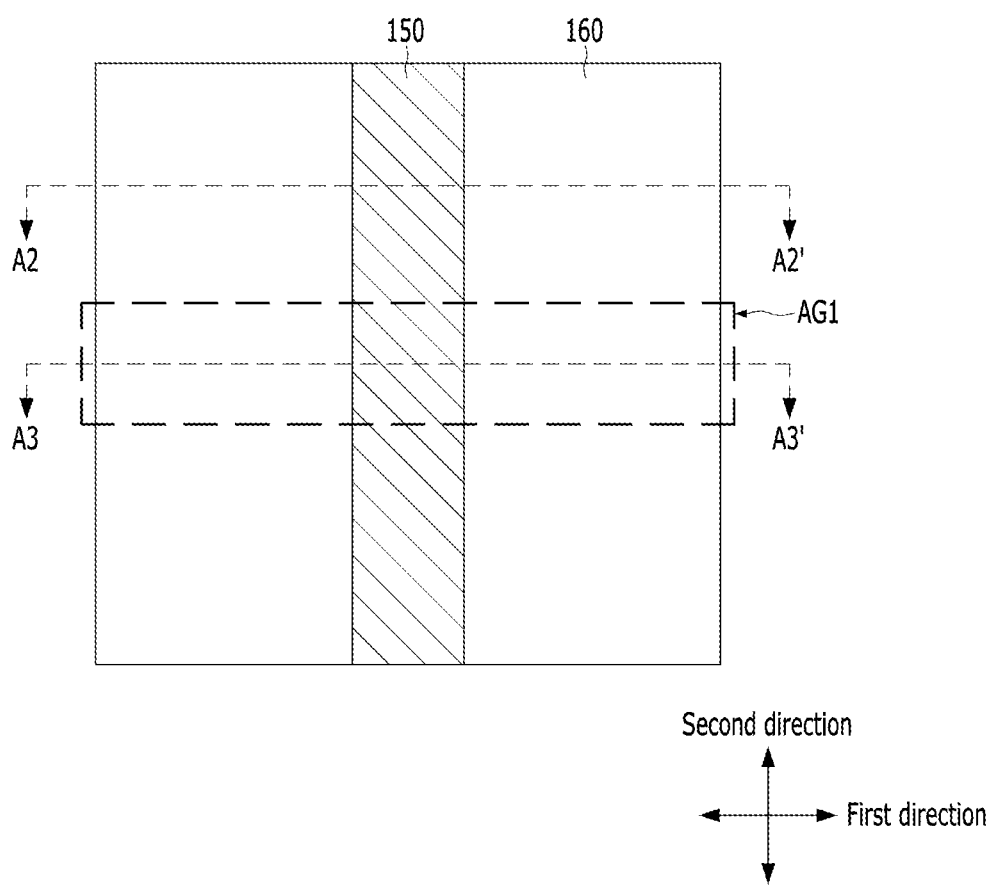
Figure 4B:
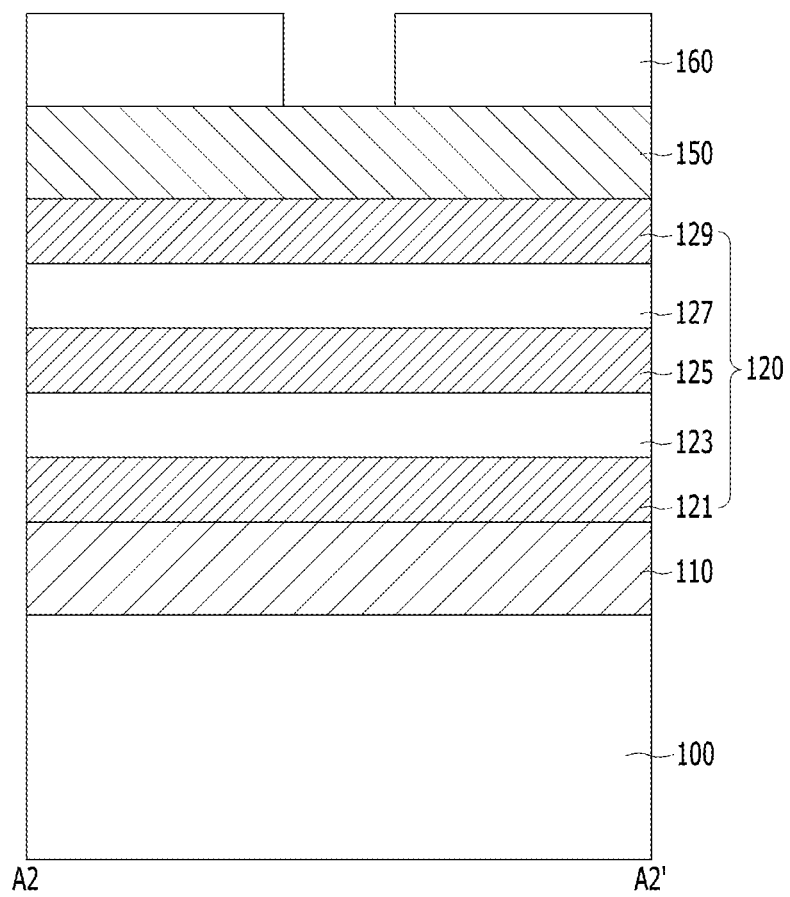
Figure 4C:
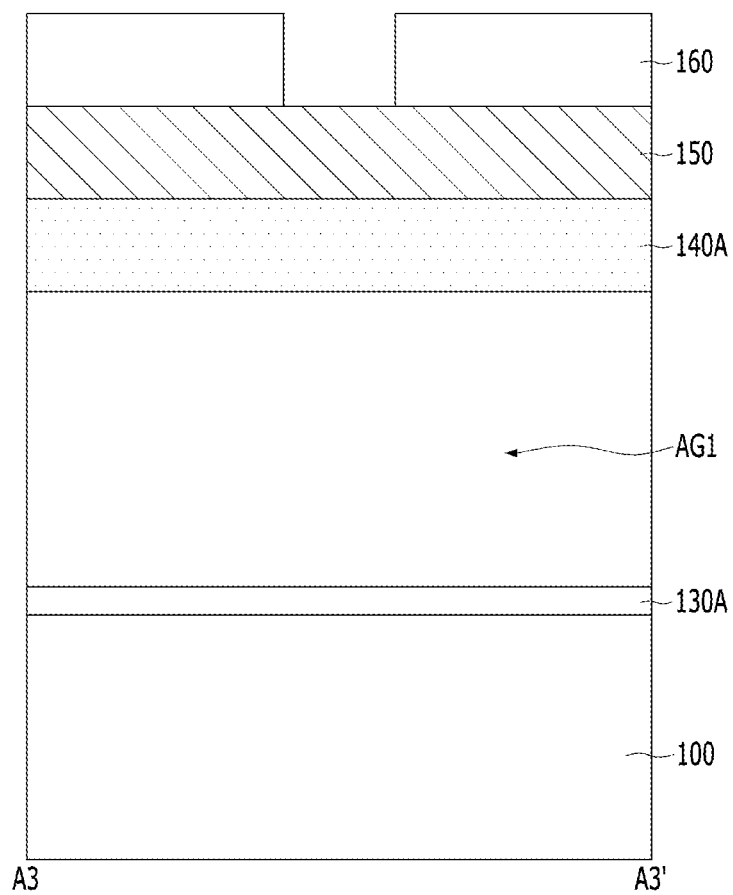

Referring to FIGS. 4A to 4C, a conductive layer 150 for forming second lines may be formed over a resultant structure of FIGS. 3A and 3B, that is, over the flat surface formed by the upper surface of the first capping layer pattern 130A, the upper surface of the second capping layer pattern 140A, and the upper surface of the initial memory cell 120. The conductive layer 150 includes a conductive material, for example a metal such as platinum (Pt), tungsten (W), aluminum (Al), copper (Cu), or tantalum (Ta), a metal nitride such as titanium nitride (TiN) or tantalum nitride (TaN), or a combination thereof.

The conductive layer 150 may have a flat plate shape covering all of the resultant structure of FIGS. 3A and 3B. Accordingly, the conductive layer 150 may include a first portion located on the upper surfaces of the initial memory cell 120 and the first capping layer pattern 130A and a second portion located on the second capping layer pattern 140A.

Subsequently, a mask pattern 160 for patterning the conductive layer 150 and the initial memory cell 120 may be formed over the conductive layer 150. The mask pattern 160 may have a line shape extending in the second direction.

Figure 5A:
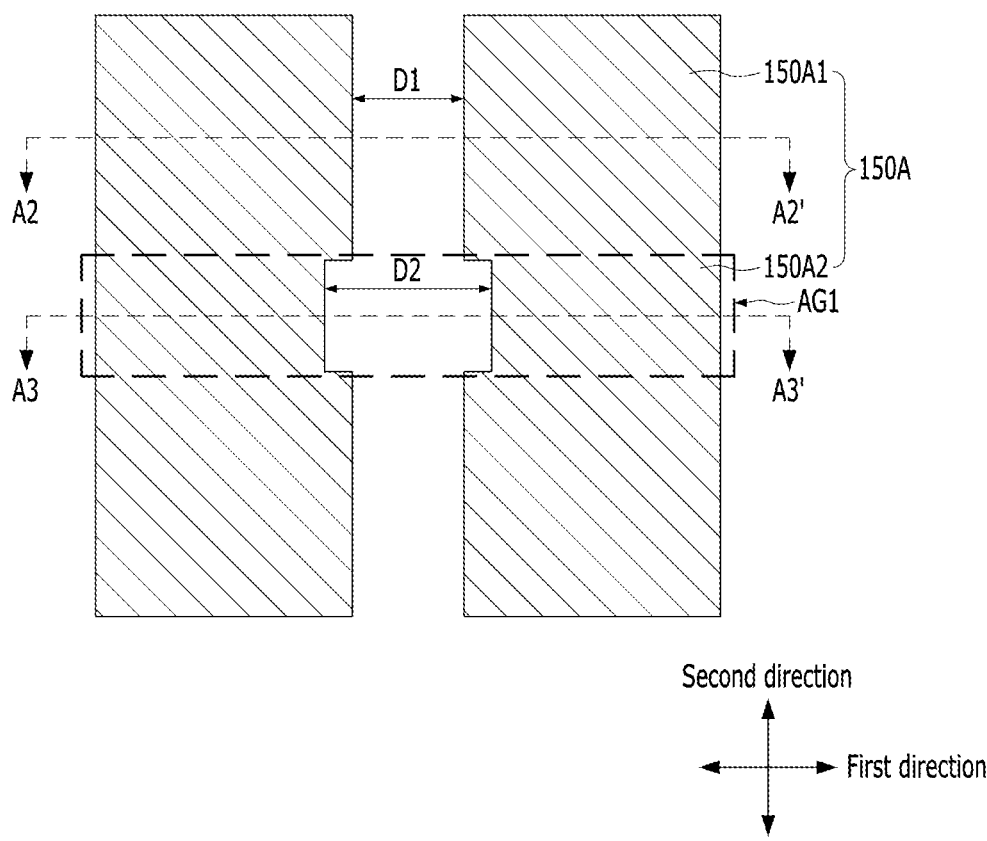
Figure 5B:
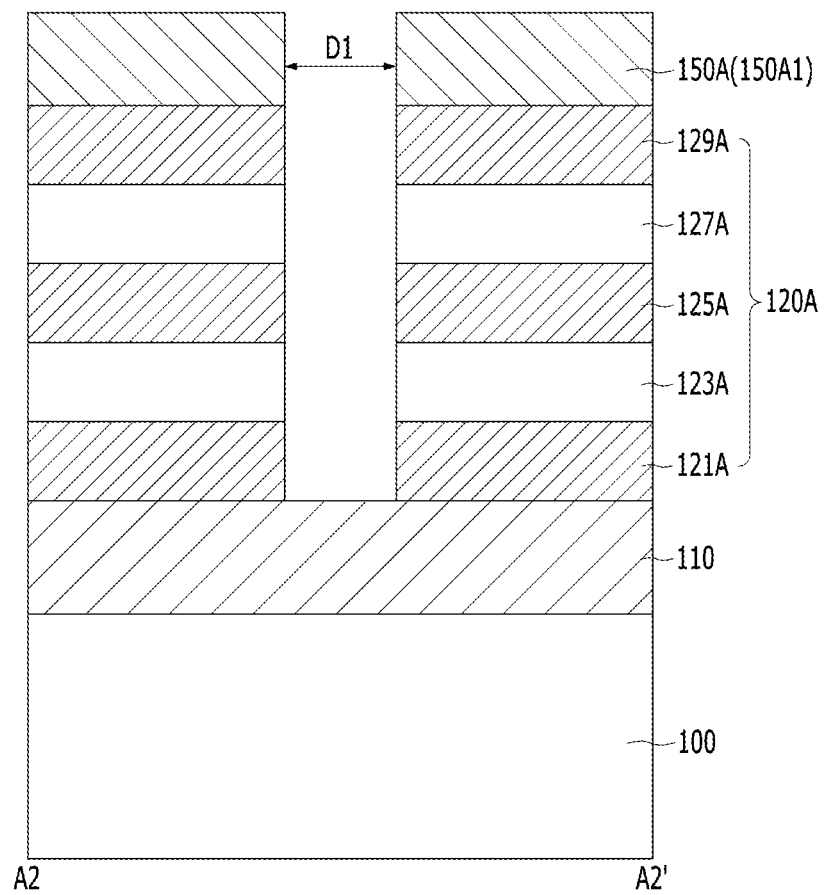
Figure 5C:
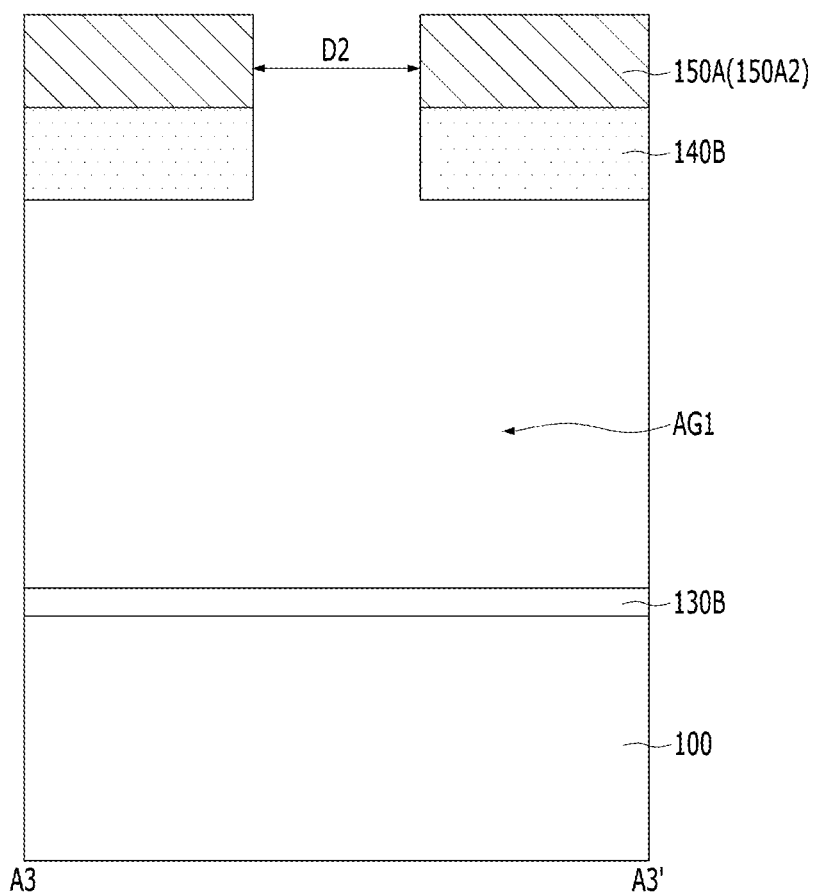
Figure 5D:
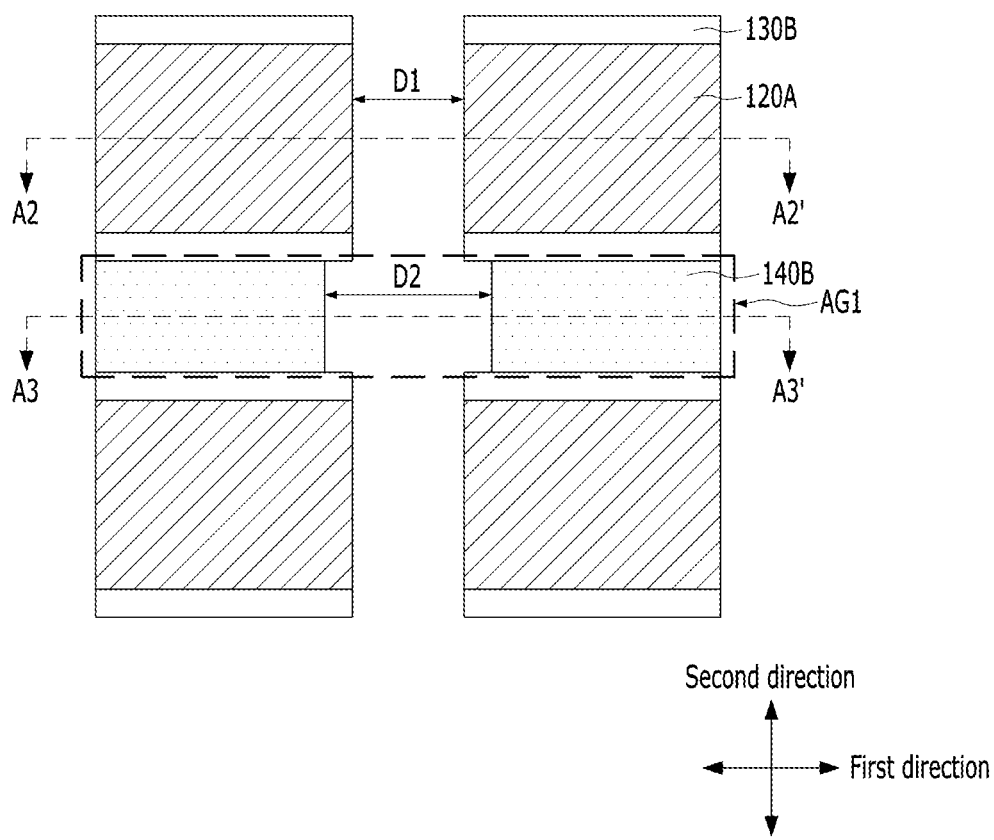
Figure 5E:
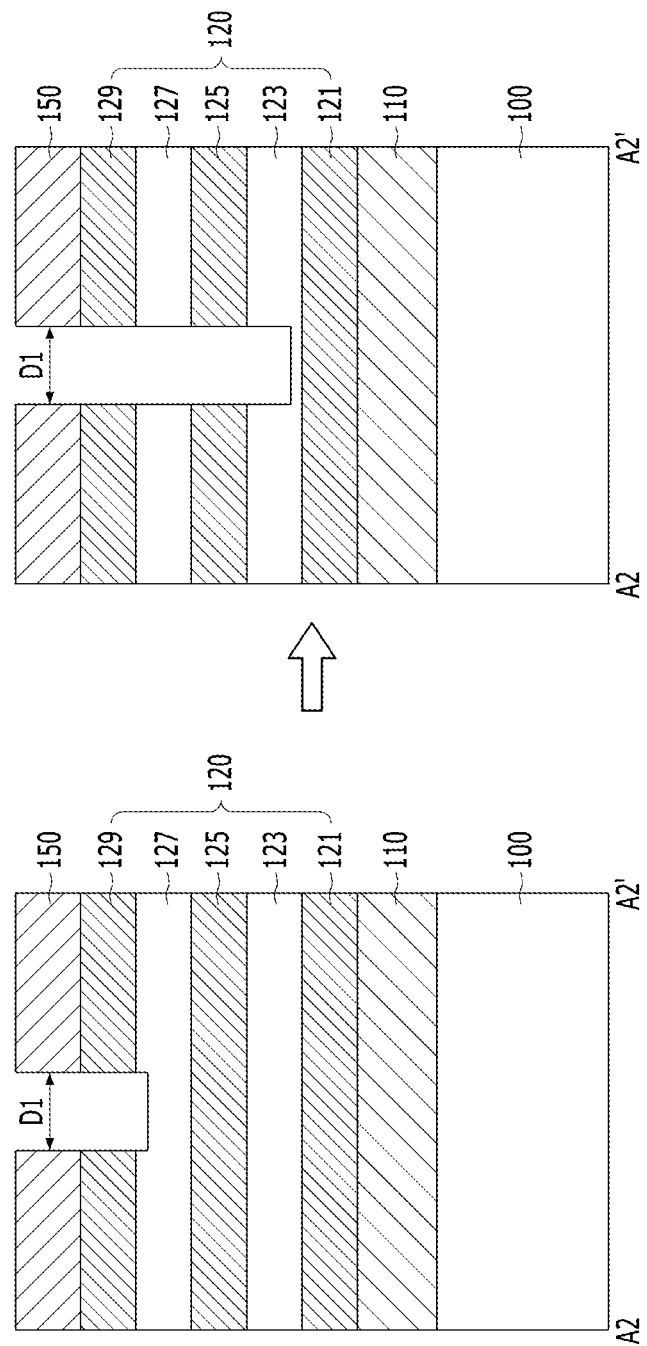
Figure 6A:
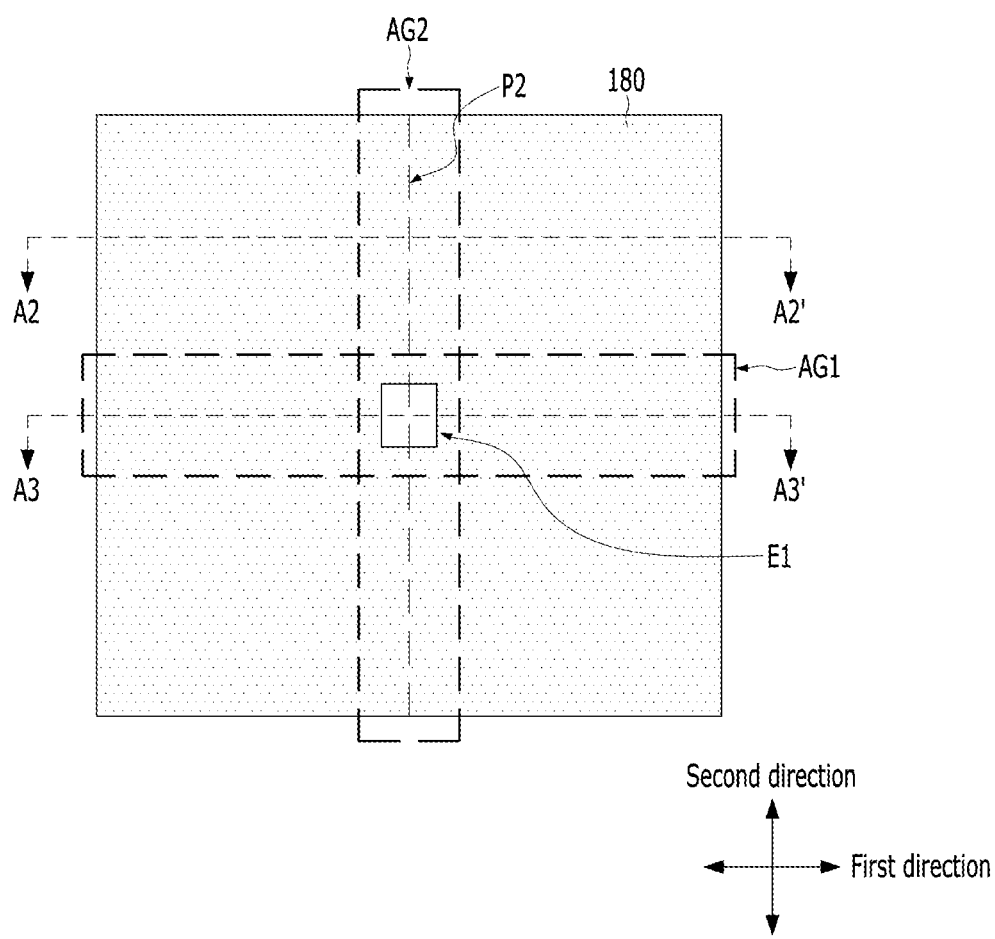
Figure 6B:
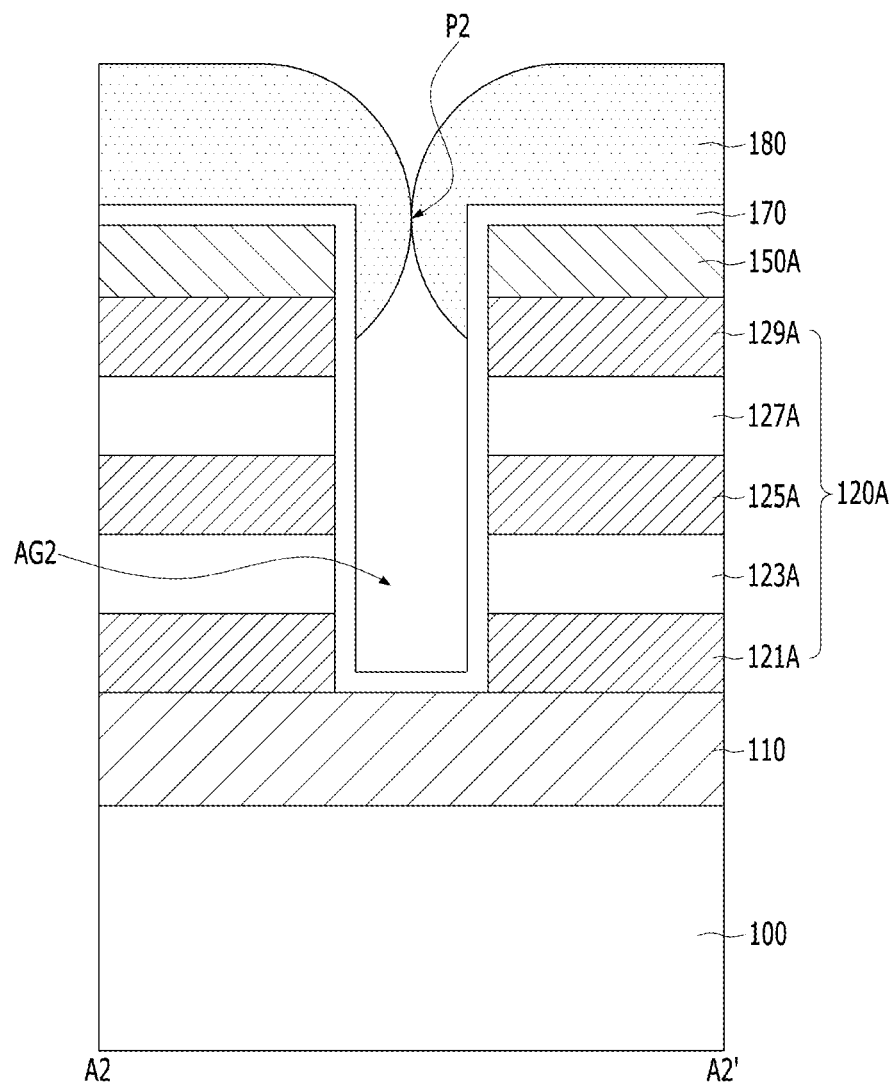
Figure 6C:
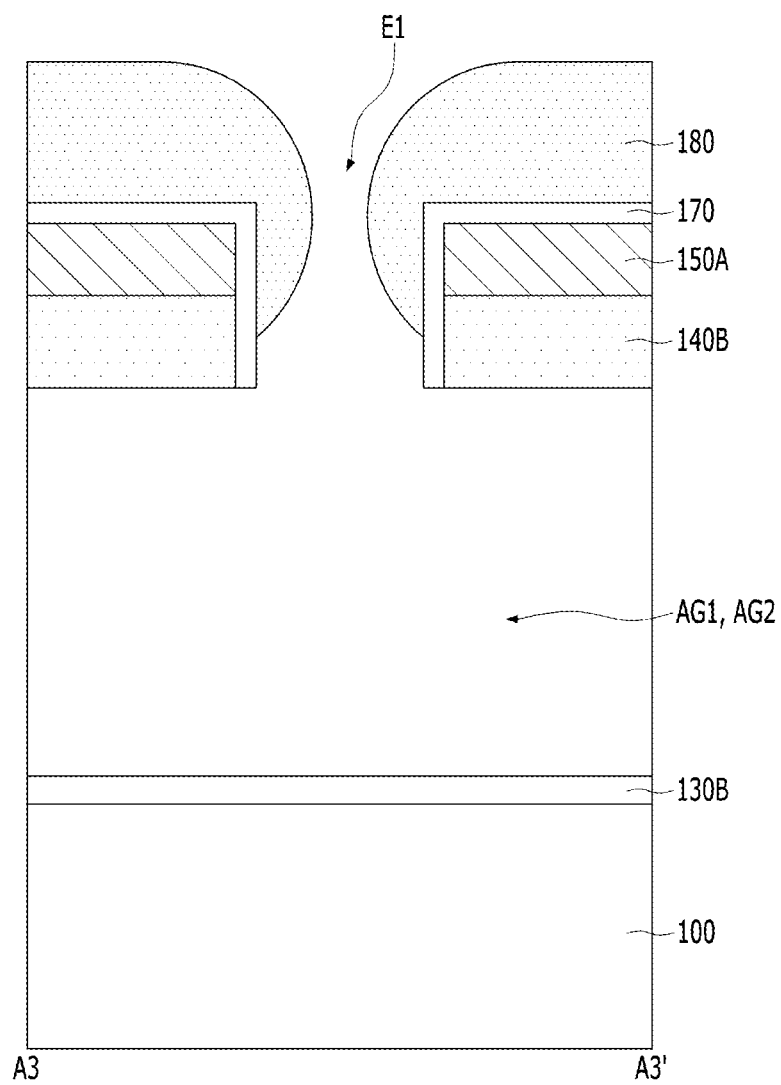
Figure 6D:
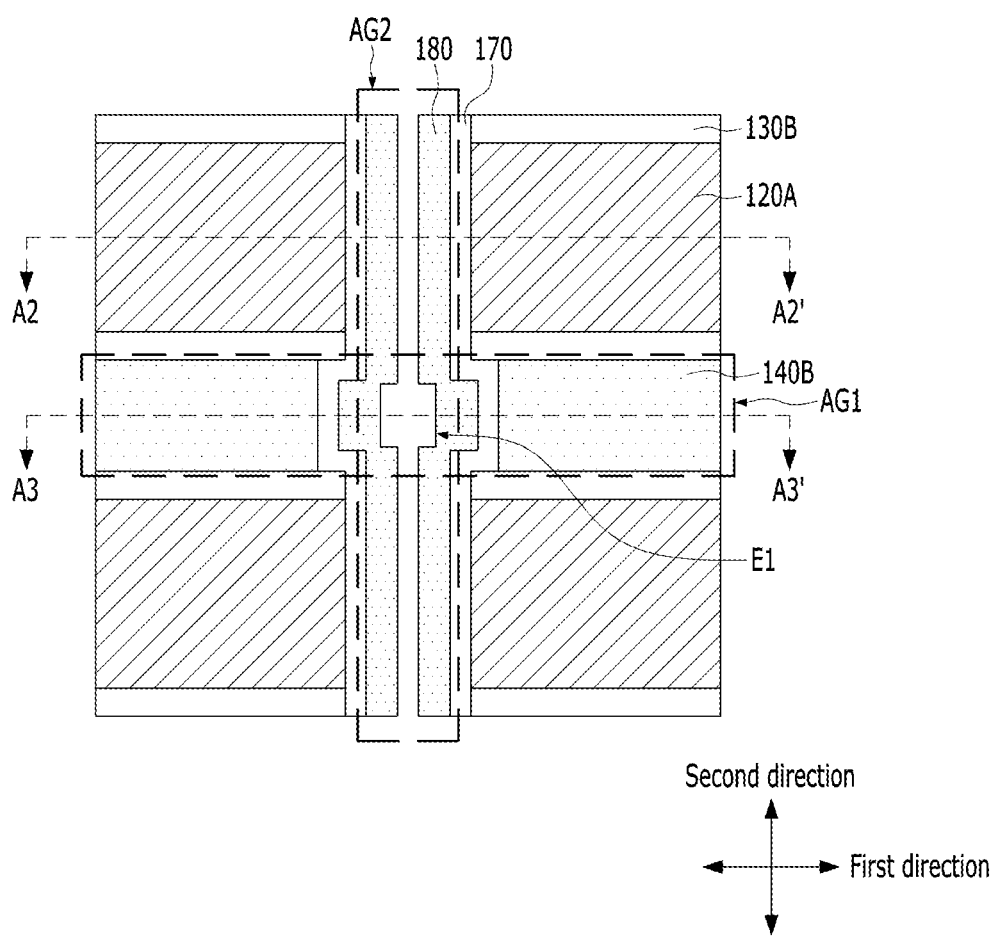
Figure 7A:
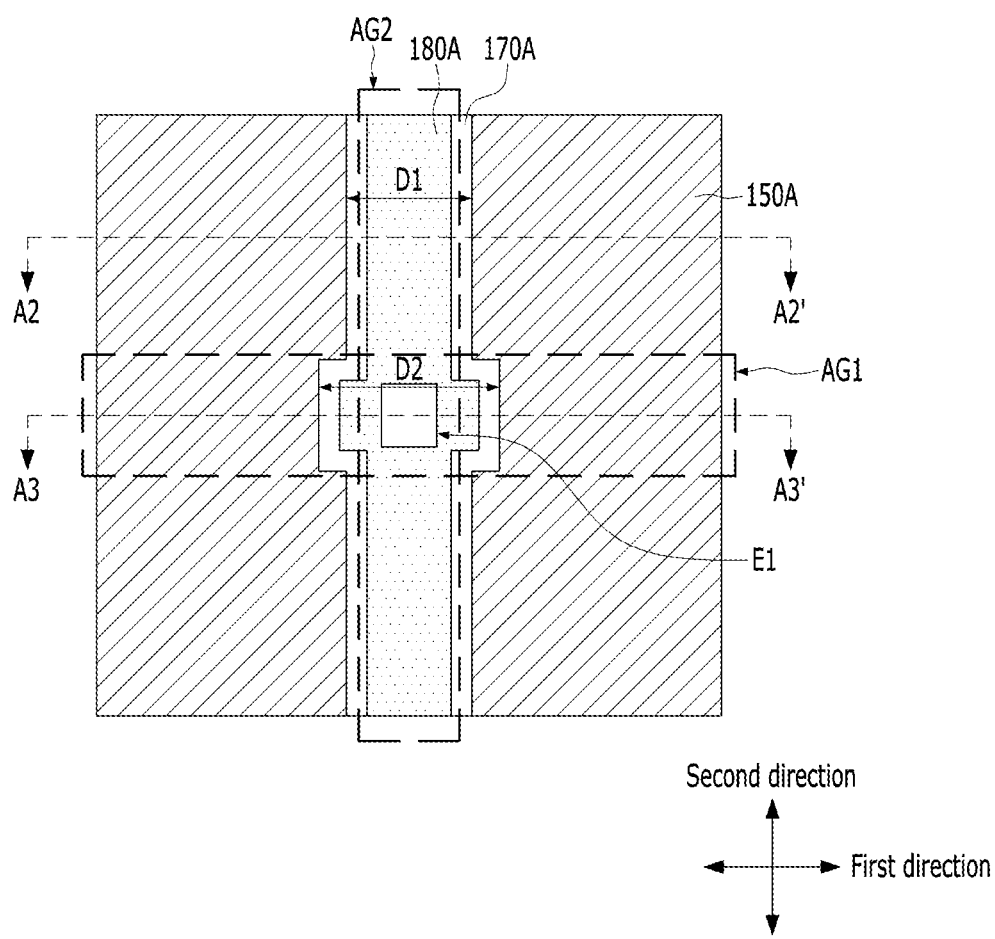
Figure 7B:
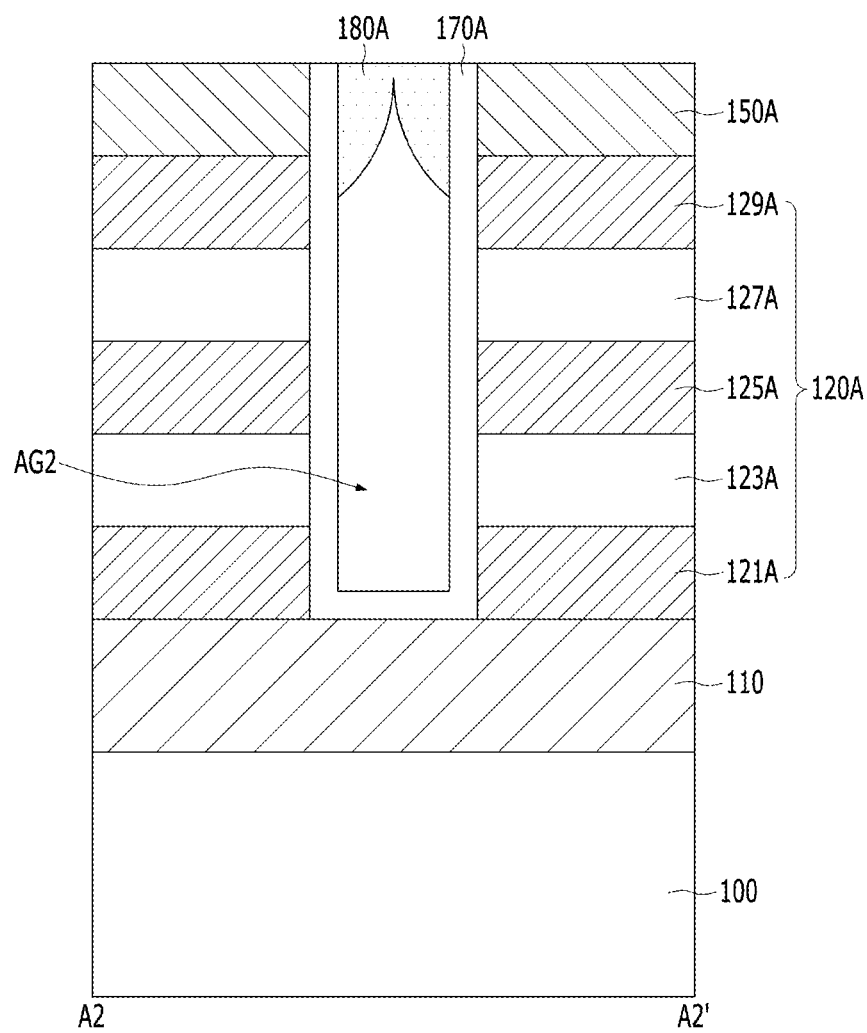
Figure 7C:
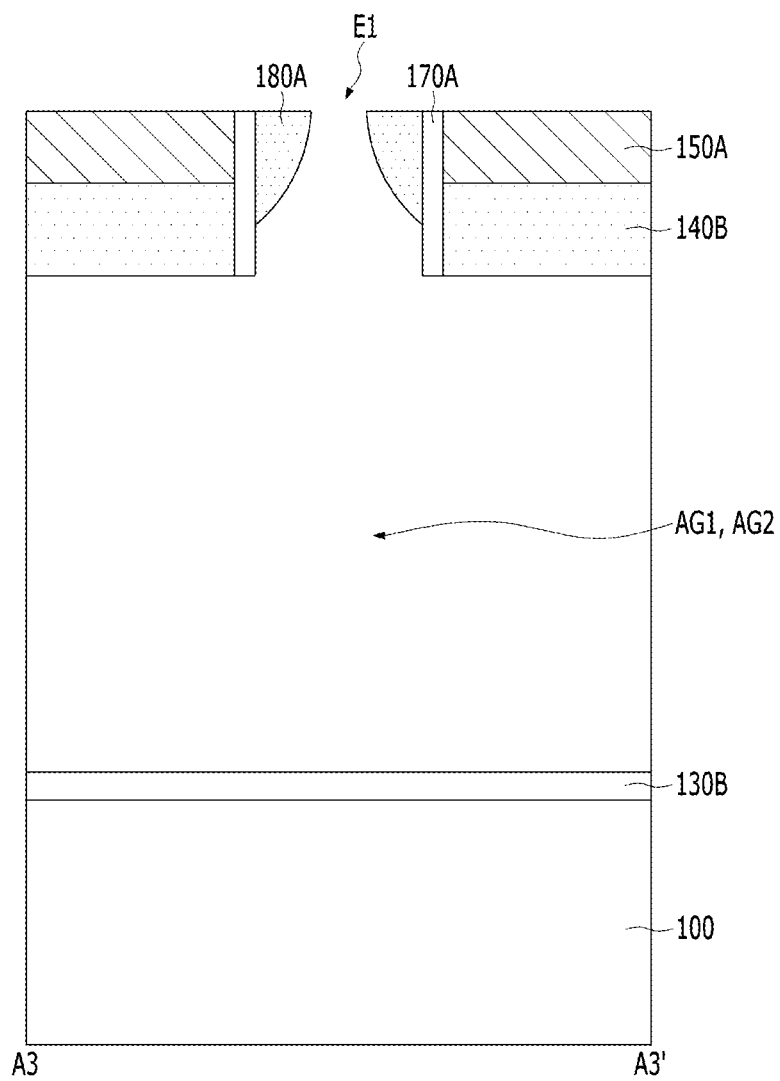
Figure 7D:
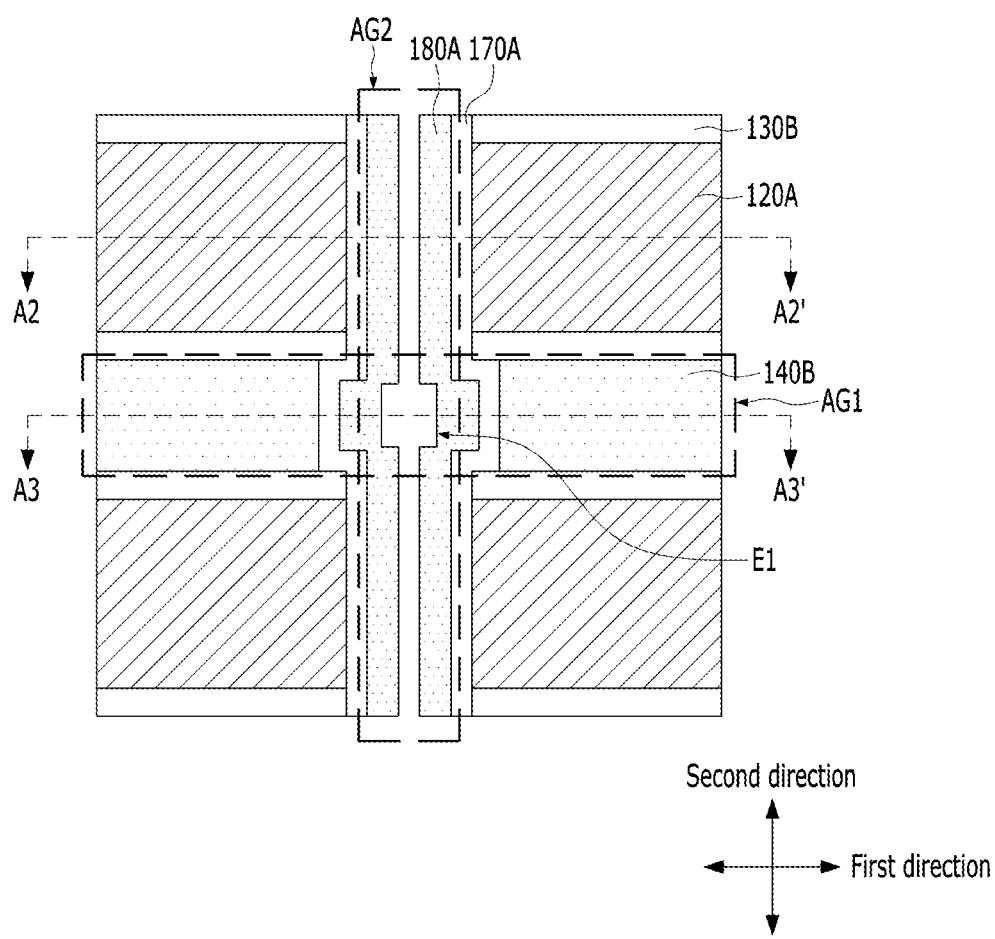

Referring to FIGS. 5A to 5D, the conductive layer 150 and the initial memory cell 120 may be etched using the mask pattern 160 as an etching barrier. As a result, second lines 150A and memory cells 120A may be formed. The second lines 150A may extend in the second direction. Although FIG. 5A shows two second lines 150A, a plurality of second lines 150A may be arranged to be spaced apart from each other in the first direction. The memory cells 120A may be disposed between the first lines 110 and the second lines 150A in the third direction and at intersections of the first lines 110 and the second lines 150A. The mask pattern 160 used in the etching process may be removed through the etching process.

The memory cell 120A may include a stacked structure of a lower electrode 121A, a selection element pattern 123A, an intermediate electrode 125A, a variable resistance pattern 127A, and an upper electrode 129A. The memory cell 120A may have an island shape. Two sidewalls of the memory cell 120A that face each other in the first direction may be aligned with the second line 150A, and two sidewalls of the memory cell 120A that face each other in the second direction may be aligned with the first line 110. When the first line 110 functions as a word line, the second line 150A may function as a bit line. Conversely, when the first line 110 functions as a bit line, the second line 150A may function as a word line. FIG. 5A shows two second lines 150A spaced apart from each other in the first direction and 2×2 memory cells 120A arranged in a matrix form in the first direction and the second direction. However, the number of the second lines 150A and the number of the memory cells 120A may be variously modified.

During the etching process, portions of the first capping layer pattern 130A and the second capping layer pattern 140A that are exposed between the two second lines 150A may also be etched. The etched first capping layer pattern 130A and the etched second capping layer pattern 140A will be referred to as a final first capping layer pattern 130B and a final second capping layer pattern 140B, respectively. The final first capping layer pattern 130B may be located only on each of the two sidewalls of the memory cell 120A that face each other in the second direction. The final second capping layer pattern 140B may be positioned on upper portions of the final first capping layer pattern 130B between two neighboring memory cells 120A in the second direction.

Meanwhile, a portion of the second line 150A that overlaps the memory cell 120A and the final first capping layer pattern 130B will be referred to as a first portion 150A1, and another portion of the second line 150A that overlaps the final second capping layer pattern 140B will be referred to as a second portion 150A2. A distance between two memory cells 120A and/or between the first portions 150A1 in the first direction will be referred to as a first distance D1, and a distance between the final second capping layer patterns 140B and/or between the second portions 150A2 in the first direction will be referred to as a second distance D2. Here, the second distance D2 may be greater than the first distance D1. The reason for this will be described below with reference to FIGS. 5E and 5F.

The process of etching the conductive layer 150 and the initial memory cell 120 may be performed by a combination of anisotropic etching and isotropic etching. During the anisotropic etching, byproducts such as a polymer may be redeposited on a side surface of an object which has been etched. The isotropic etching is performed to remove the byproducts and to form a pattern having a vertical profile. However, during the etching process, an object to be etched on the A2-A2' line is the conductive layer 150 and the initial memory cell 120, while an object to be etched on the A3-A3' line is the conductive layer 150 and the second capping layer pattern 140A. The second capping layer pattern 140A is an element that closes up the space between the two neighboring initial memory cells 120, so the second capping layer pattern 140A may have a much smaller thickness than the two neighboring initial memory cells 120. Therefore, in the middle of the process of etching the initial memory cells 120, the second capping layer pattern 140A may be completely etched before the initial memory cells 120 are fully etched, and thus the first air gap AG1 below the second capping layer pattern 140A may be exposed. A state immediately after the second capping layer pattern 140A is completely etched is shown in the left side of FIGS. 5E and 5F. At this time, a gap between the etched second capping layer patterns 140A and between the etched conductive layers 150 thereon, and a gap between the etched portions of the initial memory cell 120 and between the etched conductive layers 150 thereon may be substantially the same (see D1). However, when the rest of the initial memory cell 120 is further etched, the isotropic etching to side surfaces of the etched second capping layer patterns 140A and the etched conductive layers 150 thereon may be further performed compared to the initial memory cells 120. This is because there is no longer a material to be redeposited on the side surfaces of the etched second capping layer patterns 140A and the etched conductive layers 150 thereon. That is, as shown in the right side of FIGS. 5E and 5F, the gap between the etched portions of the initial memory cell 120 and the gap between the etched conductive layers 150 thereon may be substantially maintained (see D1). On the other hand, side portions of the etched second capping layer patterns 140A and the etched conductive layers 150 thereon may be further etched by the isotropic etching (see dotted line). Therefore, the gap between the etched second capping layer patterns 140A and the gap between the etched conductive layers 150 thereon may be increased. As a result, as shown in FIGS. 5A to 5D, the first and second distances D1 and D2 may be different from each other.

Referring to FIGS. 6A to 6D, a third capping layer 170 may be formed over a resultant structure of FIGS. 5A to 5D.

The third capping layer 170 may be formed using a film and/or a process having excellent step coverage characteristics. For example, the third capping layer 170 may be formed by an ALD method. Accordingly, the third capping layer 170 may be formed along side and upper surfaces of a stacked structure 120A and 150A in which the memory cell 120A and the second line 150A are stacked in the third direction, and formed along side and upper surfaces of a stacked structure 140B and 150A in which the final second capping layer pattern 140B and the second line 150A are stacked in the third direction. The third capping layer 170 may be formed with a small thickness that does not completely fill a space between two neighboring stacked structures 120A and 150A and a space between two neighboring stacked structures 140B and 150A in the first direction. In addition, although not shown, the third capping layer 170 may be further formed on an upper surface of the final first capping layer pattern 130B and/or an upper surface of the first line 110 that are exposed in the process.

Although not shown, the third capping layer 170 may be formed on both sidewalls of the memory cell 120A in the first direction. The third capping layer 170 may protect the memory cell 120A in a subsequent process by surrounding the entire sidewalls of the memory cell 120A together with the final first capping layer pattern 130B. The third capping layer 170 may include an insulating material, and may have a single-layered structure or a multi-layered structure. For example, the third capping layer 170 may include a silicon oxide, a silicon nitride, an insulating metal oxide, an insulating metal nitride, or a combination thereof. The third capping layer 170 may be formed of the same material as the final first capping layer pattern 130B.

Subsequently, a fourth capping layer 180 may be formed over a resultant structure in which the third capping layer 170 is formed.

The fourth capping layer 180 may be formed using a film and/or a process having poor step coverage characteristics. For example, the fourth capping layer 180 may be formed by a deposition method using HDP. Accordingly, the fourth capping layer 180 may be formed to be thick only over upper portions of the stacked structures 120A and 150A. That is, the fourth capping layer 180 may be formed only over upper surfaces of the stacked structures 120A and 150A and sidewalls of the upper portions of the stacked structures 120A and 150A. Also, the fourth capping layer 180 may be formed to cover upper surfaces and part or all of sidewalls of the stacked structures 140B and 150A. The fourth capping layer 180 may have an overhang whose side protrudes more toward a space between two neighboring stacked structures 120A and 150A in the first direction than the third capping layer 170 formed on sidewalls of the two neighboring stacked structures 120A and 150A. The overhangs of the fourth capping layer 180 on the sidewalls of the two neighboring stacked structures 120A and 150A in the first direction may contact each other (see P2) to close up the space between the two neighboring stacked structures 120A and 150A in the first direction. Also, the fourth capping layer 180 may have the overhang whose side protrudes more toward the space between the two neighboring stacked structures 140B and 150A in the first direction than the third capping layer 170 formed on sidewalls of two neighboring stacked structures 140B and 150A. However, since the distance between the two neighboring stacked structures 140B and 150A (see D2) is greater than the distance between the two neighboring stacked structures 120A and 150A (see D1) as shown in FIGS. 5A to 5D, the overhang of the fourth capping layer 180 on the sidewalls of the two neighboring stacked structures 140B and 150A may not contact each other. Therefore, an opening E1 may be formed in the fourth capping layer 180.

As a result of this process, a second air gap AG2 may be formed. The second air gap AG2 may be surrounded by the third capping layer 170 and the fourth capping layer 180 between the two neighboring stacked structures 120A and 150A in the first direction. More specifically, between the two neighboring stacked structures 120A and 150A in the first direction, a side surface and a lower surface of the second air gap AG2 may be defined by the third capping layer 170 formed along the upper surface of the first line 110 and the side surfaces of the two neighboring stacked structures 120A and 150A in the first direction, and an upper surface of the second air gap AG2 may be defined by the fourth capping layer 180. The second air gap AG2 may have a line shape extending in the second direction between the two neighboring stacked structures 120A and 150A in the first direction. Accordingly, the second air gap AG2 may be connected to the first air gap AG1 in a region between the two neighboring stacked structures 140B and 150A in the first direction. That is, an intersection region of the first air gap AG1 and the second air gap AG2 may be formed in the region between the two neighboring stacked structures 140B and 150A in the first direction. As a result, in a plan view, the first and second air gaps AG1 and AG2 may have a cross shape as a whole between four memory cells 120A arranged in a 2×2 matrix. The intersection region of the first and second air gaps AG1 and AG2 may overlap the opening E1 of the fourth capping layer 180, so may not be blocked with the fourth capping layer 180. The opening E1 may be located in a center among the four memory cells 120A arranged in the 2×2 matrix, and may be located within the fourth capping layer 180.

The fourth capping layer 180 may include an insulating material. For example, the fourth capping layer 180 may include a silicon oxide, a silicon nitride, an insulating metal oxide, an insulating metal nitride, or a combination thereof. The fourth capping layer 180 may be formed of the same material as the final second capping layer pattern 140B.

Referring to FIGS. 7A to 7D, a planarization process such as a CMP process may be performed until the upper surface of the second line 150A is exposed. As a result, the third capping layer 170 and the fourth capping layer 180 on the upper surface of the second line 150A may be removed to form a third capping layer pattern 170A and a fourth capping layer pattern 180A.

The third capping layer pattern 170A may be formed along side surfaces of the two neighboring stacked structures 120A and 150A in the first direction and the upper surface of the first line 110 between the two neighboring stacked structures 120A and 150A in the first direction. In addition, the third capping layer pattern 170A may be formed along side surfaces of the two neighboring stacked structures 140B and 150A in the first direction. The fourth capping layer pattern 180A may close up the space between each two neighboring stacked structures 120A and 150A in the first direction, and have a line shape extending in the second direction. The fourth capping layer pattern 180A may have the opening E1 without blocking an upper portion of the space between the two neighboring stacked structures 140B and 150A in the first direction. An upper surface of the third capping layer pattern 170A and an upper surface of the fourth capping layer pattern 180A may form a flat surface together with the upper surface of the second line 150A. That is, the upper surface of the third capping layer pattern 170A and the upper surface of the fourth capping layer pattern 180A may be level with the upper surface of the second line 150A.

During the planarization process, the second air gap AG2 under the fourth capping layer pattern 180A may be maintained together with the first air gap AG1.

Referring to FIGS. 8A to 8D, a heat sink 190 may be formed by injecting a material having a high thermal conductivity into the first and second air gaps AG1 and AG2 through the opening E1.

The heat sink 190 may absorb heat generated from the memory cell 120A, particularly from the variable resistance pattern 127A, to reduce or block heat transfer from the memory cell 120A to its adjacent memory cell 120A. The heat sink 190 may include a metal having a high thermal conductivity, such as silver, copper, lead, tin, magnesium, zinc, iron, gold, aluminum, iridium, molybdenum, nickel, platinum, beryllium, cadmium, cobalt, titanium, tungsten, or the like. The heat sink 190 may include a metal compound having a high thermal conductivity, such as titanium nitride, tungsten nitride, or the like. A heat dissipation pattern (not shown) may be connected to the heat sink 190 to release the heat absorbed by the heat sink 190 to the outside.

The material injected into the opening E1 to form the heat sink 190 may be a flowable material. In this case, a process of curing the flowable material may be further performed in a subsequent process. At this time, by adjusting the viscosity of the flowable material to be relatively high, it may be possible to prevent the flowable material from flowing into the first and second air gaps AG1 and AG2 too much. Accordingly, the heat sink 190 may be formed to have a pillar shape in the intersection region of the first and second air gaps AG1 and AG2. In an embodiment, side surfaces of the heat sink 190 is substantially perpendicular to the upper surface of the substrate 100. However, in another embodiment, the heat sink 190 may have inclined side surfaces so that a width of the heat sink 190 in a plan view may increase from top to bottom in the third direction. A slope of the inclined side surface may depend on the viscosity of the flowable material. A flat area of the heat sink 190 in a plan view may be larger than that of the opening E1, and further, may be equal to or larger than that of the intersection region of the first and second air gaps AG1 and AG2. The heat sink 190 may be located in the center among the four memory cells 120A arranged in the 2×2 matrix.

Thus, the memory device can be manufactured as shown in FIGS. 8A to 8D.

Referring again to FIGS. 8A to 8D, the memory device of the present embodiment may include the plurality of first lines 110 formed over the substrate 100 and extending in the first direction, the plurality of second lines 150A formed over the first lines 110 and extending in the second direction, and the plurality of memory cells 120A formed in the intersection regions of the first lines 110 and the second lines 150A between the first lines 110 and the second lines 150A in the third direction.

Here, the heat sink 190 having a pillar shape may be located in the center among the four memory cells 120A arranged in the 2×2 matrix. That is, the heat sink 190 may be positioned between two neighboring memory cells 120A in a diagonal direction with respect to the first direction and the second direction. The heat generated from the memory cell 120A may move in a direction toward the heat sink 190, that is, in the diagonal direction with respect to the first and second directions. The heat moves toward the heat sink 190 because the heat sink 190 has a high thermal conductivity. Therefore, thermal disturbance due to heat transfer between the memory cells 120A may be significantly reduced or prevented.

The first air gap AG1 extending in the first direction may be disposed between two neighboring memory cells 120A arranged in the second direction, and the second air gap AG2 extending in the second direction may be disposed between two neighboring memory cells 120A arranged in the first direction. Since the first air gap AG1 and the second air gap AG2 are filled with air having a low thermal conductivity, heat transfer between the memory cells 120A arranged in the first and second directions may be reduced or blocked. In particular, since heat is concentrated to the heat sink 190 as described above, heat transfer in the first and second directions may be further reduced or blocked.

The heat sink 190 may be disposed in each of the intersection regions of the first and second air gaps AG1 and AG2. Therefore, both side surfaces or sidewalls of the memory cell 120A in the second direction may be electrically insulated from the heat sink 190 while being protected by the final first capping layer pattern 130B, and both side surfaces or sidewalls of the memory cell 120A in the first direction may be electrically insulated from the heat sink 190 while being protected by the third capping layer pattern 170A.

The upper portion of the first air gap AG1 between the two neighboring memory cells 120A arranged in the second direction may be blocked by the final second capping layer pattern 140B attached to the upper portion of the final first capping layer pattern 130B. Also, the upper portion of the second air gap AG2 between the two neighboring memory cells 120A arranged in the first direction may be blocked by the fourth capping layer pattern 180A attached to the upper portion of the third capping layer pattern 170A. However, the intersection region of the first air gap AG1 and the second air gap AG2 may be opened by the opening E1 formed in the fourth capping layer pattern 180A. The upper surface of the fourth capping layer pattern 180A formed after the second line 150A is formed may be at a higher level in the third direction than an upper surface of the final second capping layer pattern 140B formed after the initial memory cell 120 is formed.

An uppermost portion of the heat sink 190 may be surrounded by the fourth capping layer pattern 180A as shown in FIGS. 8A and 8C. At least a part of a lower portion of the heat sink 190, except for the uppermost portion of the heat sink 190, may be surrounded by the first air gap AG1 and the second air gap AG2 as shown in FIGS. 8C and 8D.

The memory device manufactured as described above may obtain the following effects.

First, by arranging a heat sink in a center among memory cells arranged in a 2×2 matrix along the first direction and the second direction, heat generated from the memory cells may be concentrated to the heat sink, thereby reducing heat transfer between the memory cells. Furthermore, heat transfer between the memory cells in the first direction and the second direction can be further reduced by placing an air gap between the memory cells in the first direction and the second direction. As a result, since thermal disturbance of the memory device can be reduced or prevented, the operating characteristics of the memory device can be secured, and reliability of the memory device can be improved.

Furthermore, by performing a process using step coverage characteristics of an insulating material without adding an additional mask and etching process during the process of forming the heat sink and the air gap, the manufacturing processes of the memory device may be simplified.

Figure 9A:
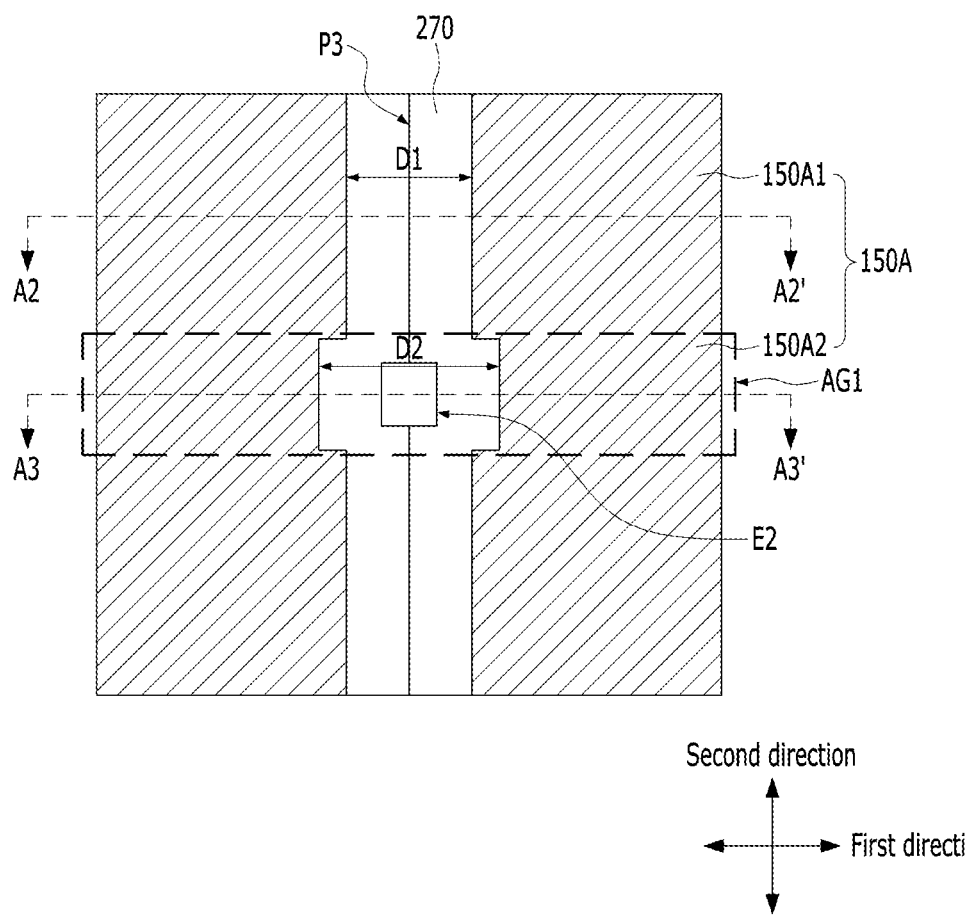
FIGS. 9A to 10D are views illustrating a semiconductor memory and a method of fabricating the same according to another embodiment of the present disclosure.
Figure 9B:
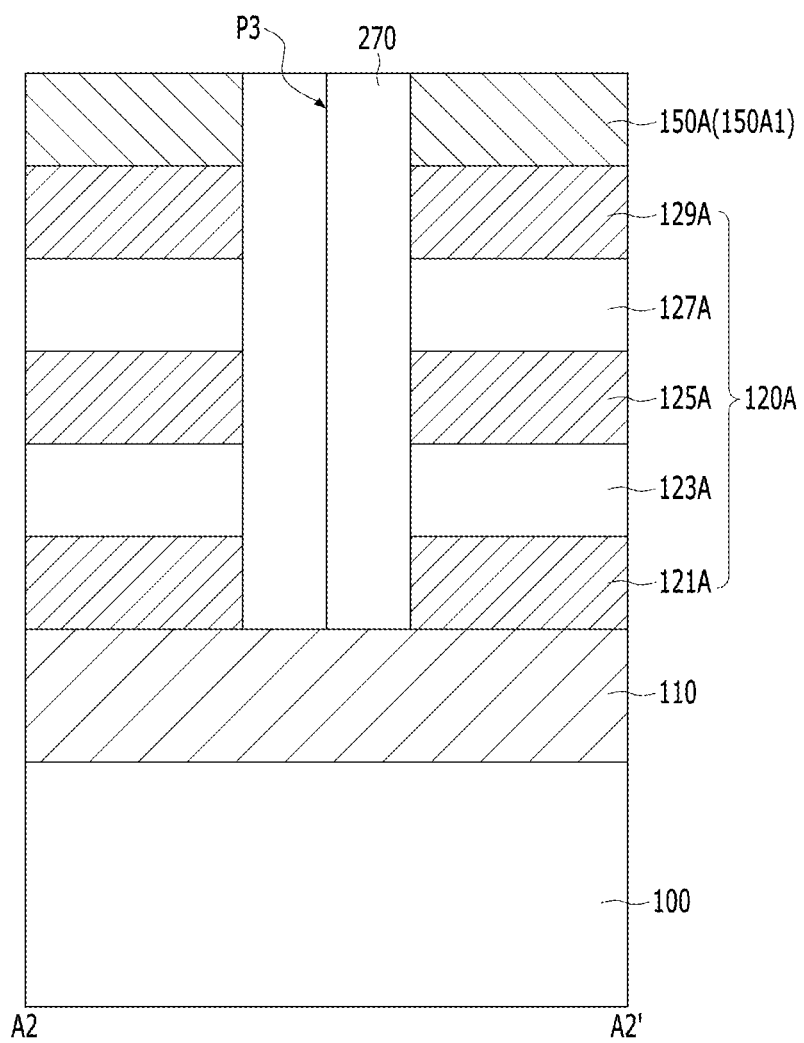
Figure 9C:
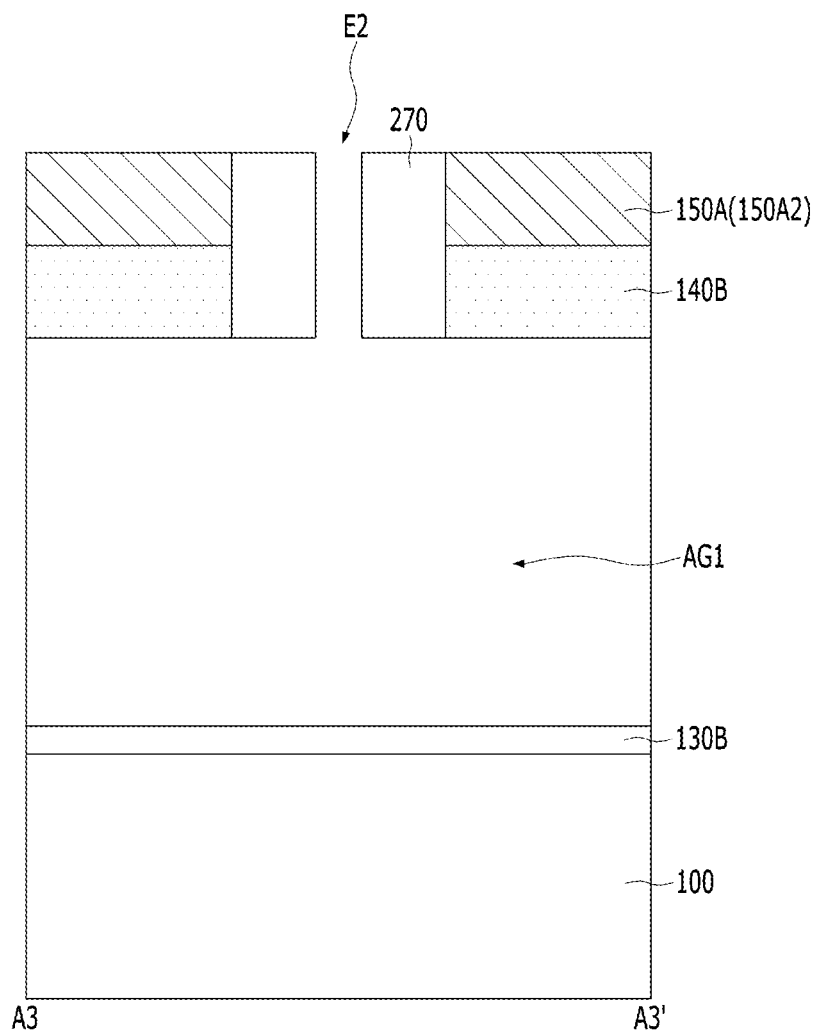
Figure 9D:
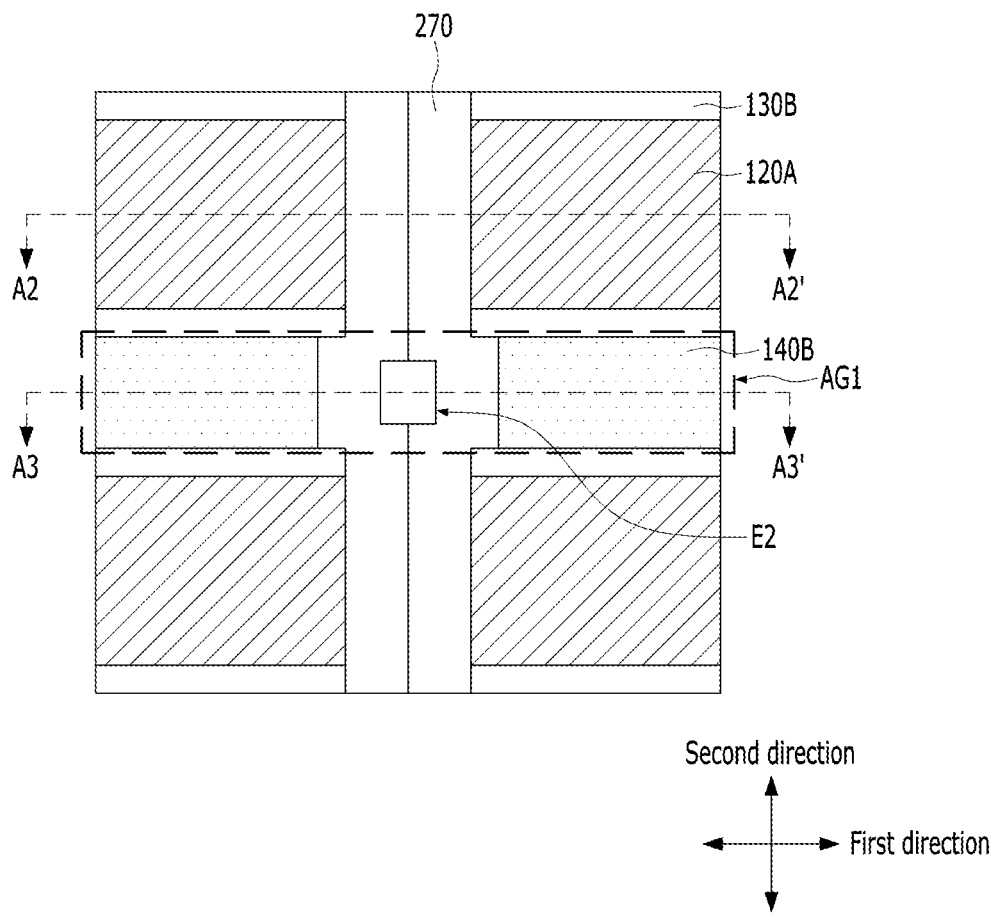
Figure 10A:
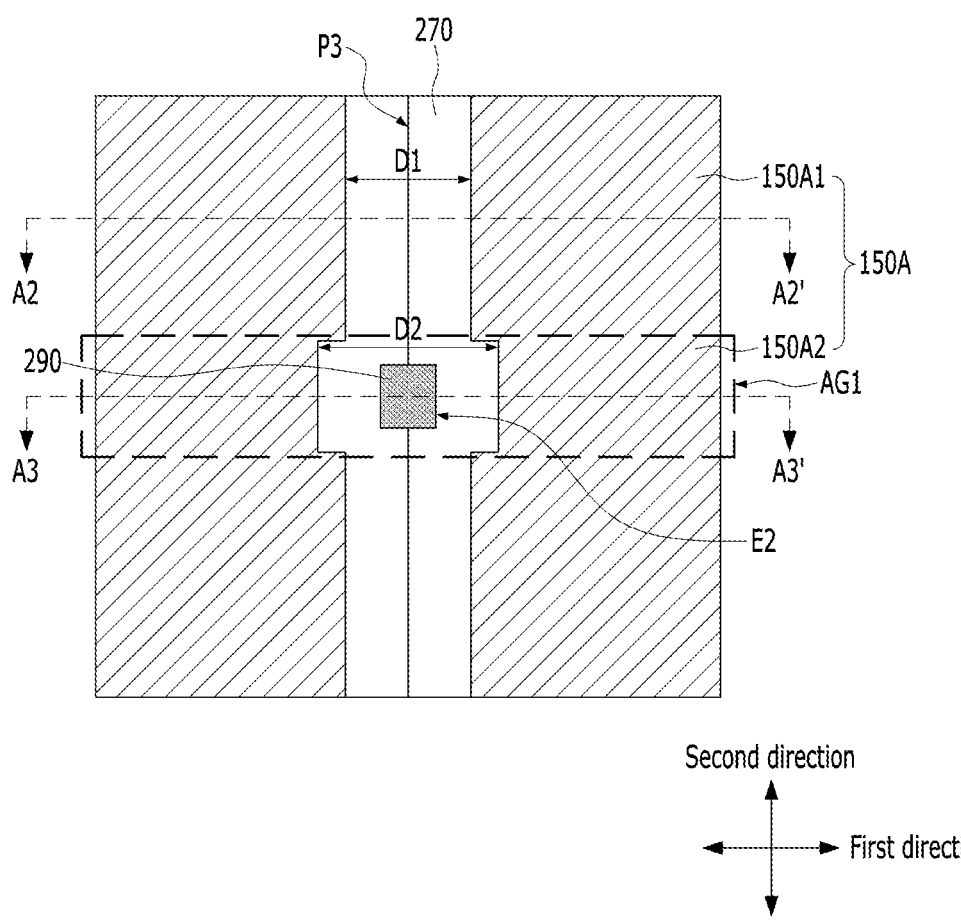
Figure 10B:
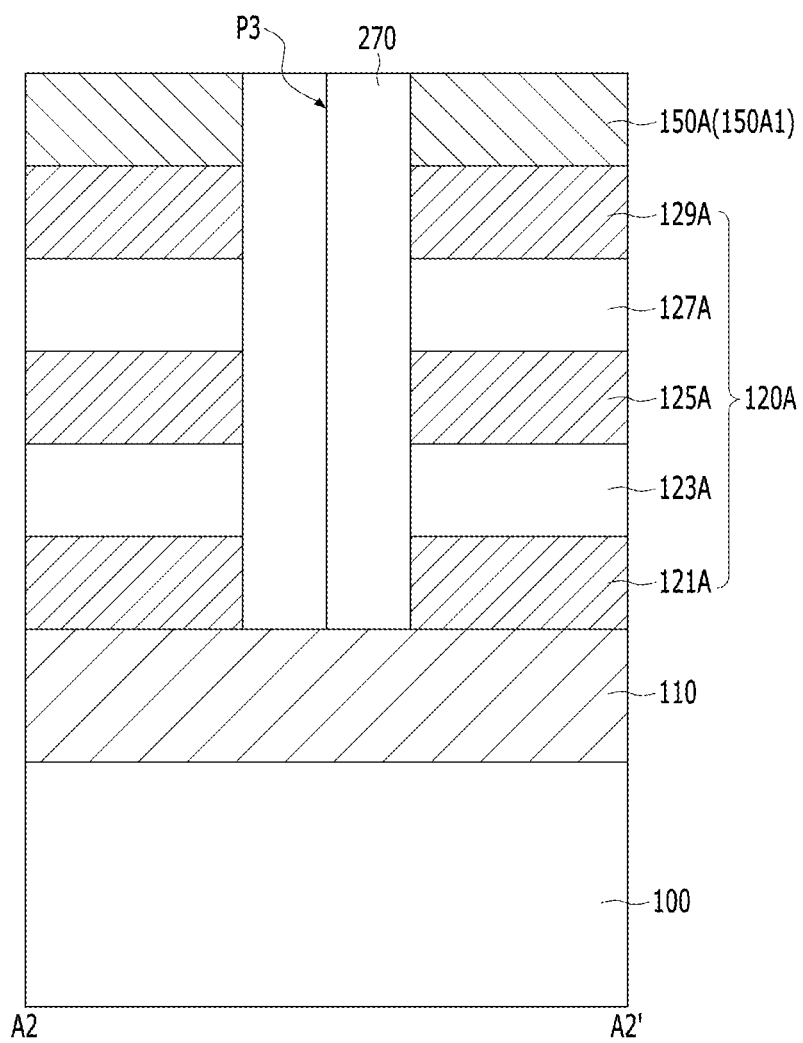
Figure 10C:
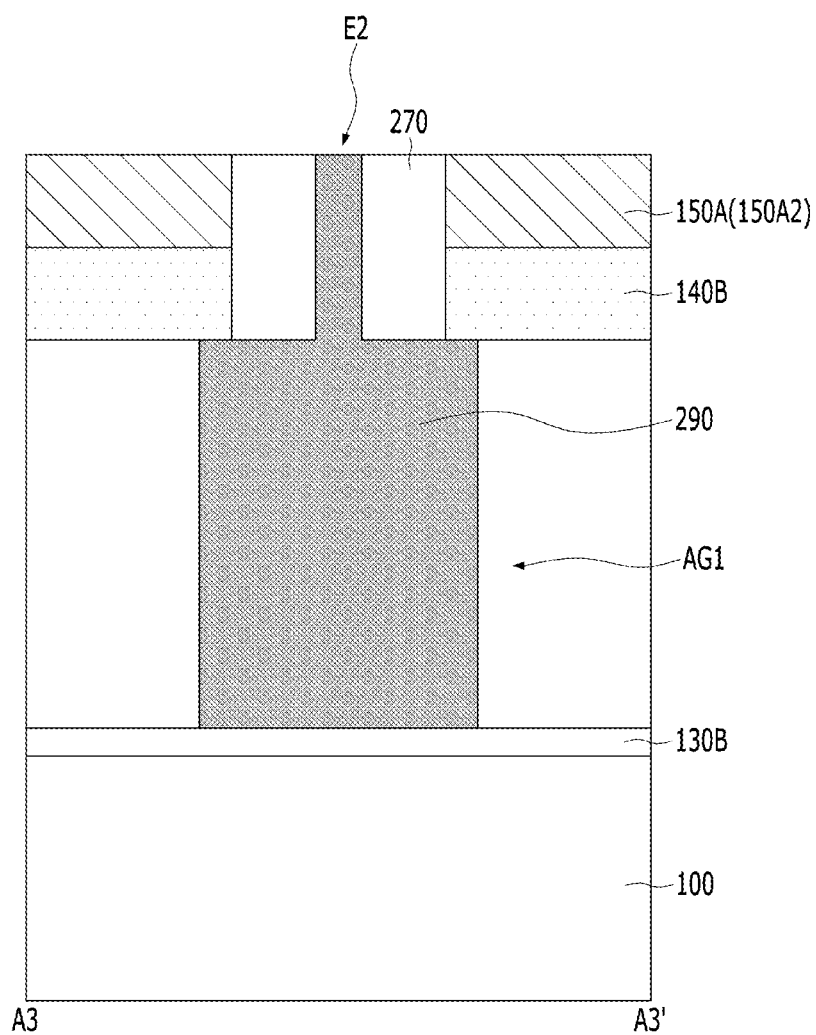
Figure 10D:
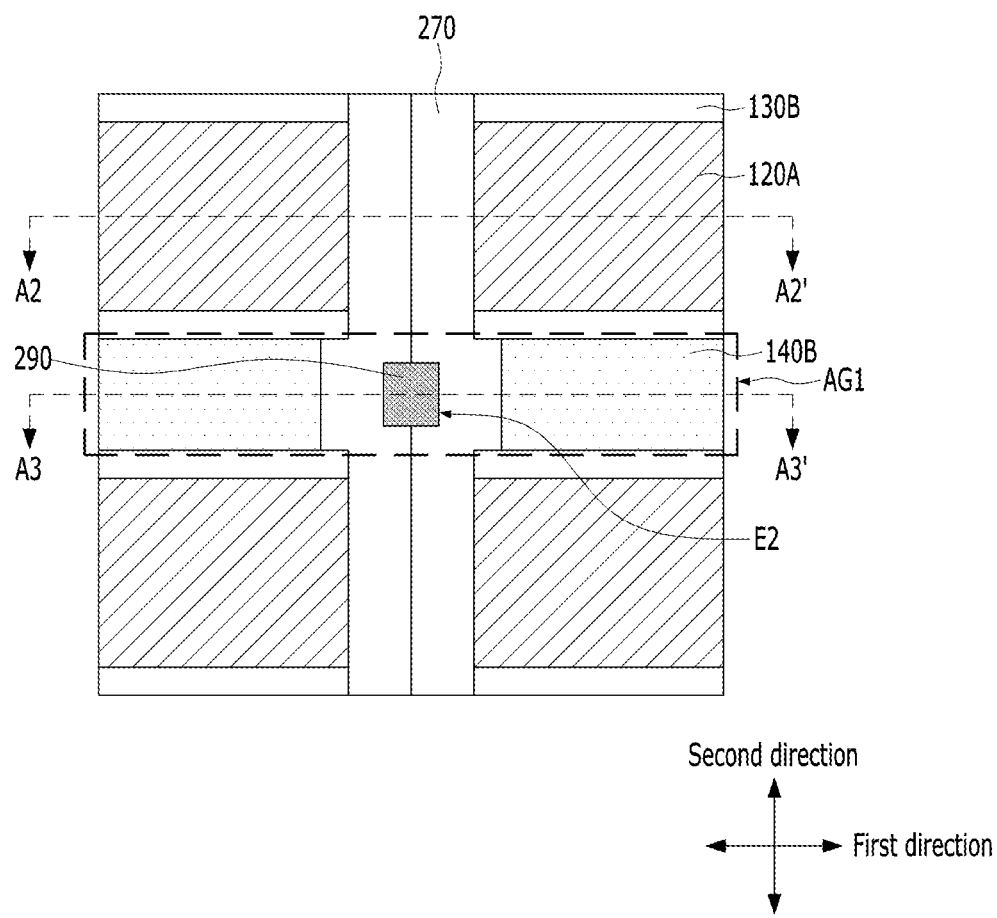

FIGS. 9A to 10D are views illustrating a semiconductor memory and a method of fabricating the same according to another embodiment of the present disclosure. FIG. 9A is a plan view, FIGS. 9B and 9C are cross-sectional views taken along lines A2-A2' and A3-A3' of FIG. 9A, respectively, and FIG. 9D is a plan view at a height of an upper surface of a memory cell. FIG. 10A is a plan view, FIGS. 1013 and 10C are cross-sectional views taken along lines A2-A2' and A3-A3' of FIG. 10A, respectively, and FIG. 10D is a plan view at a height of the upper surface of the memory cell. Differences between the embodiment described with reference to FIGS. 1A to 8D and the present embodiment illustrated in FIGS. 9A to 10D will be mainly described.

First, by performing the processes of FIGS. 1A to 5D of the above-described embodiment, the same structure as the structure shown in FIGS. 5A to 5D may be obtained.

Subsequently, referring to FIGS. 9A to 9D, a third capping layer 270 may be formed to have a thickness so that the third capping layer 270 completely fills the space between the neighboring stacked structures 120A and 150A in the first direction while not completely filling the space between the neighboring stacked structures 140B and 150A in the first direction.

The third capping layer 270 may be formed by depositing an insulating material using a film and/or a process having excellent step coverage characteristics over the resultant structure of FIGS. 5A to 5D, and performing a planarization process until the upper surface of the second line 150A is exposed. The deposition process may be performed until the space between the neighboring stacked structures 120A and 150A in the first direction is completely filled with the insulating material and at least a part of the space between the neighboring stacked structures 140B and 150A in the first direction remains. As described above, since the distance D1 between the neighboring stacked structures 120A and 150A in the first direction is smaller than the distance D2 between the neighboring stacked structures 140B and 150A in the first direction, the space between the neighboring stacked structures 120A and 150A in the first direction may be first filled with the insulating material during the deposition process of the insulating material using the film and/or the process having excellent step coverage characteristics. When the deposition is stopped as the space between the neighboring stacked structures 120A and 150A in the first direction is filled with the insulating material, a structure as shown in FIGS. 9A to 9D may be obtained. A space defined by the third capping layer 270 between the neighboring stacked structures 140B and 150A in the first direction will be referred to as an opening E2.

Referring to FIGS. 10A to 10D, a heat sink 290 may be formed by injecting a material having a high thermal conductivity through the opening E2.

Thus, the memory device may be manufactured as shown in FIGS. 10A to 10D.

Referring again to FIGS. 10A to 10D, the memory device of the present embodiment may include the plurality of first lines 110 formed over the substrate 100 and extending in the first direction, the plurality of second lines 150A formed over the first lines 110 and extending in the second direction, and the plurality of memory cells 120A formed in the intersection regions of the first lines 110 and the second lines 150A between the first lines 110 and the second lines 150A in the third direction.

Here, the heat sink 290 having a pillar shape may be located in the center among four memory cells 120A arranged in the 2×2 matrix.

The first air gap AG1 extending in the first direction may be disposed between two neighboring memory cells 120A arranged in the second direction. On the other hand, the third capping layer 270, instead of an air gap, may fill the space between two neighboring memory cells 120A arranged in the first direction. In order to make the degree of heat transfer between memory cells 120A in the first direction equal or similar to the degree of heat transfer between memory cells 120A in the second direction, an insulating material having a thermal conductivity that is less than or equal to a thermal conductivity of air may be used to form the third capping layer 270. For example, a low-k material may be used to form the third capping layer 270.

Both side surfaces or sidewalls of the memory cell 120A in the second direction may be electrically insulated from the heat sink 290 while being protected by the final first capping layer pattern 130B, and both side surfaces or sidewalls of the memory cell 120A in the first direction may be electrically insulated from the heat sink 290 while being protected by the third capping layer 270.

An uppermost portion of the heat sink 290 may be surrounded by the third capping layer 270. At least a part of a lower portion of the heat sink 290, except for the uppermost portion of the heat sink 290, may face the first air gap AG1 in the first direction and may face the third capping layer 270 in the second direction.

The above and other memory circuits or semiconductor memory devices manufactured based on the disclosed technology can be applied in various devices or systems. FIGS. 11 to 14 provide some devices or systems that include the memory devices disclosed herein.

Figure 11:
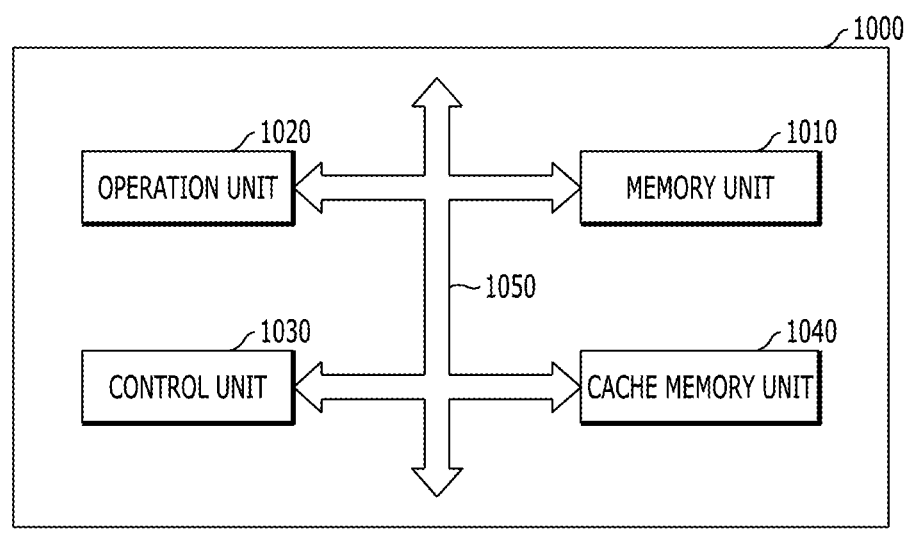
FIG. 11 is a configuration diagram of a microprocessor implementing memory circuitry based on the disclosed technology.

FIG. 11 is a configuration diagram of a microprocessor implementing memory circuitry based on the disclosed technology. Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be any of various data processing units such as a central processing unit (CPU), a graphic processing unit (GPU), a digital signal processor (DSP), an application processor (AP), and so on.

The memory unit 1010 is a component, which stores data in the microprocessor 1000, as a processor register, register, or the like. The memory unit 1010 may include various registers such as a data register, an address register, a floating point register, and so on. The memory unit 1010 may perform a function of temporarily storing data for operations to be performed by the operation unit 1020, result data of performing the operations, and addresses where data for performing the operations are stored.

The memory unit 1010 may include one or more of the above-described semiconductor devices in accordance with the embodiments. For example, the memory unit 1010 may include a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions. Through this, reliability and operating characteristics of the memory unit 1010 may be improved, and fabricating processes thereof may be facilitated. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and an external device of the microprocessor 1000, perform extraction commands from the received signals, decoding the commands, controlling input and output of signals of the microprocessor 1000, and execute processing represented by programs.

The microprocessor 1000 according to the present embodiment may additionally include a cache memory unit 1040 which can temporarily store data inputted from an external device other than the memory unit 1010 or data to be outputted to an external device. In this case, the cache memory unit 1040 may exchange data with the memory unit 1010, the operation unit 1020, and the control unit 1030 through a bus interface 1050.

Figure 12:
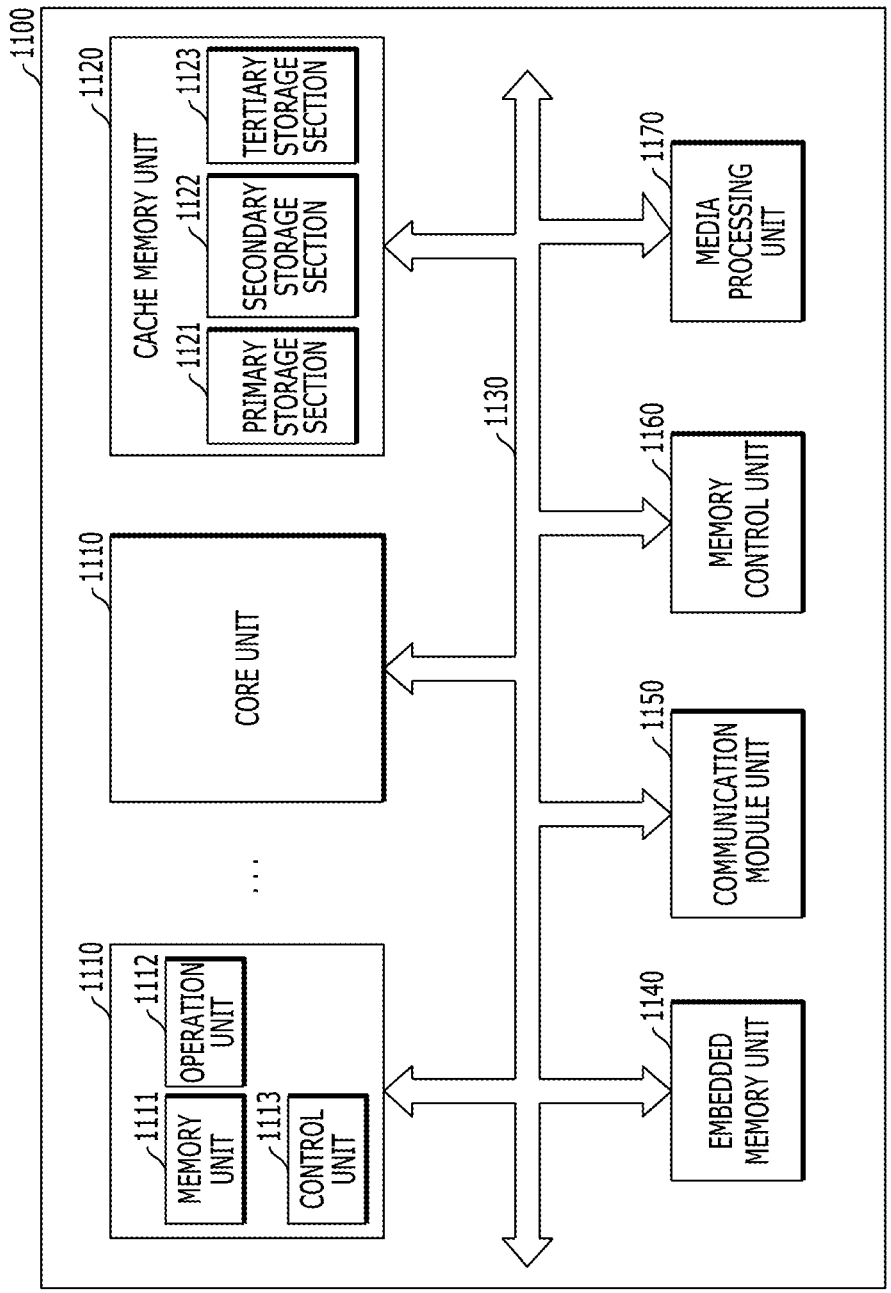
FIG. 12 is a configuration diagram of a processor implementing memory circuitry based on the disclosed technology.

FIG. 12 is a configuration diagram of a processor implementing memory circuitry based on the disclosed technology.

Referring to FIG. 12, a processor 1100 may improve performance and realize multi-functionality by including various functions other than those of the above-described microprocessor 1000 of FIG. 11. The processor 1100 may include a core unit 1110 which serves as a microprocessor, a cache memory unit 1120 which stores data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030 shown in FIG. 11.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122, and the tertiary storage section 1123 of the cache memory unit 1120 may include one or more of the above-described semiconductor devices in accordance with the embodiments. For example, the cache memory unit 1120 may include a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions. Through this, reliability and operating characteristics may be improved, and fabricating processes may be facilitated in the cache memory unit 1120. As a consequence, it is possible to improve operating characteristics of the processor 1100.

Although it is shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and an external device, and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include one or more of a DRAM (dynamic random access memory), a mobile DRAM, an SRAM (static random access memory), and a memory with similar functions to above mentioned memories. The nonvolatile memory may include one or more of a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions to above mentioned memories.

The communication module unit 1150 may include a module capable of being connected with a wired network, a module capable of being connected with a wireless network, or both of them. The wired network module may include a local area network (LAN), a universal serial bus (USB), an Ethernet, power line communication (PLC) such as various devices which send and receive data through transmission lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmission lines, and so on.

The memory control unit 1160 is to administrate and process data transmitted between the processor 1100 and an external storage device that operate according to different communication standards. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or data inputted in the forms of image, voice and others from the external interface device and output data to the external interface device. The media processing unit 1170 may include one or more of a graphic processing unit (GPU), a digital signal processor (DSP), a high definition audio device (HD audio), a high definition multimedia interface (HDMI) controller, and so on.

Figure 13:
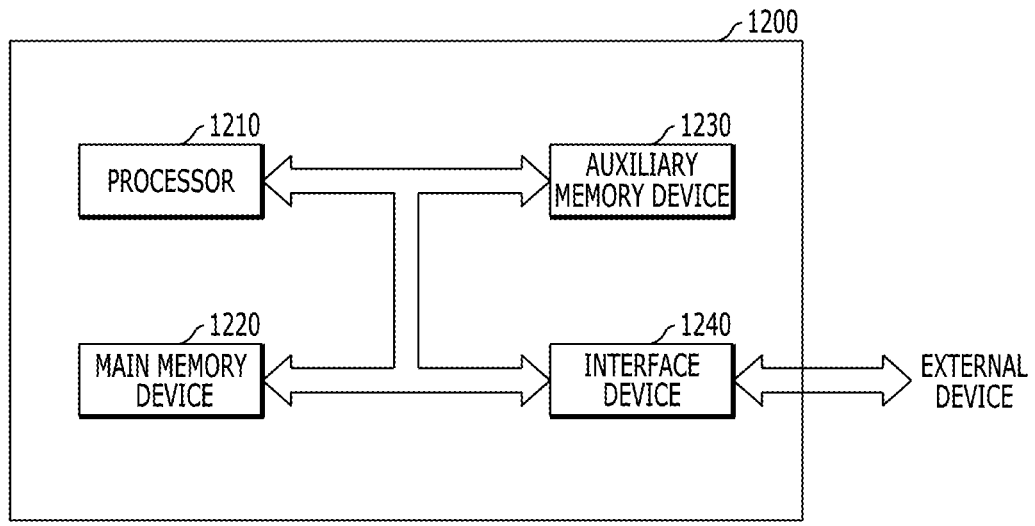
FIG. 13 is a configuration diagram of a system implementing memory circuitry based on the disclosed technology.

FIG. 13 is a configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for data stored in the system 1200, and controls these operations. The processor 1210 may be substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions. Through this, reliability and operating characteristics may be improved, and fabricating processes thereof may be facilitated in the main memory device 1220 or the auxiliary memory device 1230. As a consequence, it is possible to improve operating characteristics of the system 1200.

Also, the main memory device 1220 or the auxiliary memory device 1230 may include a memory system (see reference numeral 1300 of FIG. 14) in addition to the above-described semiconductor device or without including the above-described semiconductor device.

The interface device 1240 may perform exchange of commands and data between the system 1200 of the present embodiment and an external device. The interface device 1240 may be a keypad, a keyboard, a mouse, a speaker, a mike, a display, any of various human interface devices (HIDs), a communication device, or a combination thereof. The communication device may be substantially the same as the above-described communication module unit 1150 of FIG. 12.

Figure 14:
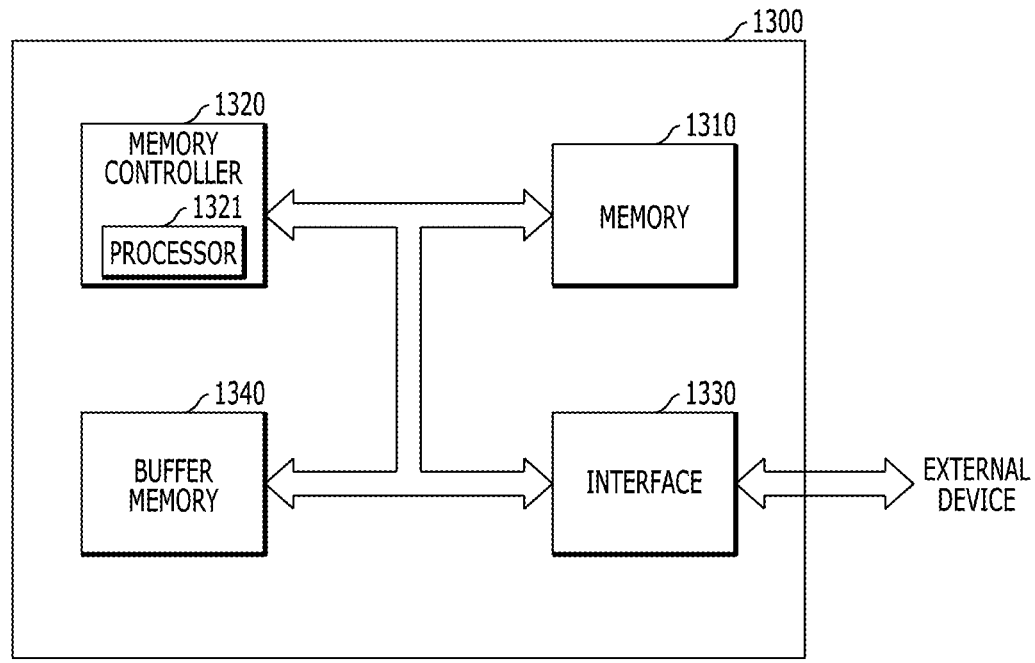
FIG. 14 is a configuration diagram of a memory system implementing memory circuitry based on the disclosed technology.

FIG. 14 is a configuration diagram of a memory system implementing memory circuitry based on the disclosed technology.

Referring to FIG. 14, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), or a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1310 or the buffer memory 1340 may include one or more of the above-described semiconductor devices in accordance with the embodiments. For example, the memory 1310 or the buffer memory 1340 may include a plurality of first lines extending in a first direction; a plurality of second lines over the first lines, the second lines extending in a second direction crossing the first direction; a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions. Through this, in the memory 1310 or the buffer memory 1340, reliability and operating characteristics may be improved, and fabricating processes may be facilitated. As a consequence, it is possible to improve operating characteristics of the memory system 1300.

The memory 1310 or the buffer memory 1340 may include one or more of various memories such as a non-volatile memory and a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for processing commands inputted through the interface 1330 from an outside of the memory system 1300 and so on.

The interface 1330 performs exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having different types from each other.

Features in the above examples of electronic devices or systems shown in FIGS. 11-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities, and so on.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. An electronic device comprising a semiconductor memory, wherein the semiconductor memory comprises:
a plurality of first lines extending in a first direction;
a plurality of second lines over the first lines, the second lines extending in a second direction crossing the first direction;
a plurality of memory cells disposed at intersection regions of the first lines and the second lines between the first lines and the second lines in a third direction perpendicular to the first and second directions;
a first air gap positioned between two neighboring memory cells in the second direction;
a second air gap positioned between two neighboring memory cells in the first direction; and
a heat sink positioned between two memory cells adjacent to each other in a diagonal direction with respect to the first and second directions,
wherein the first air gap extends in the first direction,
the second air gap extends in the second direction, and
the heat sink overlaps an intersection region of the first air gap and the second air gap.

2. The electronic device according to claim 1, wherein the heat sink has a pillar shape.

3. The electronic device according to claim 1, wherein the semiconductor memory further comprises:
first capping layer patterns positioned on both sidewalls of a memory cell in the second direction;
a second capping layer pattern blocking an upper portion of a space between first capping layer patterns positioned on sidewalls of the two neighboring memory cells in the second direction;
third capping layer patterns positioned on both sidewalls of the memory cell in the first direction; and
a fourth capping layer pattern blocking an upper portion of a space between third capping layer patterns positioned on sidewalls of the two neighboring memory cells in the first direction.

4. The electronic device according to claim 3, wherein an uppermost portion of the heat sink is surrounded by the fourth capping layer pattern.

5. The electronic device according to claim 4, wherein the space between the first capping layer patterns and the space between the third capping layer patterns are filled with air, and
at least a part of a lower portion of the heat sink is surrounded by the air.

6. The electronic device according to claim 1, wherein a memory cell includes a phase change material.

7. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

8. The electronic device according to claim 1, further comprising a processor which includes:
a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

9. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

10. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

11. The electronic device according to claim 3, wherein the semiconductor memory further comprises:

an air gap positioned between the two neighboring memory cells in the second direction; and a third capping layer positioned between the two neighboring memory cells in the first direction.

12. The electronic device according to claim 11, wherein a thermal conductivity of the third capping layer is less than or equal to a thermal conductivity of air.

13. The electronic device according to claim 11, wherein the air gap extends in the first direction, the third capping layer extends in the second direction, and the heat sink is in contact with the air gap in the first direction and in contact with the third capping layer in the second direction.

14. An electronic device comprising a semiconductor memory, wherein the semiconductor memory comprises:

a plurality of first lines extending in a first direction;

a plurality of second lines over the first lines, the second lines extending in a second direction crossing the first direction;

a plurality of memory cells disposed at intersection regions of the first lines and the second lines between the first lines and the second lines in a third direction perpendicular to the first and second directions;

a heat sink positioned between two memory cells adjacent to each other in a diagonal direction with respect to the first and second directions;

first capping layer patterns positioned on both sidewalls of a memory cell in the second direction;

a second capping layer pattern blocking an upper portion of a space between first capping layer patterns positioned on sidewalls of two neighboring memory cells in the second direction; and a third capping layer filling a space between two neighboring memory cells in the first direction.

15. The electronic device according to claim 14, wherein, when the heat sink is positioned beside the two neighboring memory cells in the first direction, an uppermost portion of the heat sink is surrounded by the third capping layer.

16. The electronic device according to claim 15, wherein the space between the first capping layer patterns is filled with air, and the heat sink is in contact with the air in the first direction and in contact with the third capping layer in the second direction.

17. An electronic device comprising a semiconductor memory, wherein the semiconductor memory comprises:

a plurality of first lines extending in a first direction;

a plurality of second lines over the first lines, the second lines extending in a second direction crossing the first direction;

a plurality of memory cells disposed at intersection regions of the first lines and the second lines between the first lines and the second lines in a third direction perpendicular to the first and second directions; and a heat sink positioned between two memory cells adjacent to each other in a diagonal direction with respect to the first and second directions, wherein both sidewalls of a memory cell in the first direction are aligned with a second line, and both sidewalls of the memory cell in the second direction are aligned with a first line, and wherein, in the first direction, a portion of the second line, which overlaps the memory cell, has a first width, and a portion of the second line, which overlaps a space between two neighboring memory cells in the second direction, has a second width, and the first width is greater than the second width.

* * * * *